United States Patent
Yamashita et al.

(10) Patent No.: US 7,791,041 B2
(45) Date of Patent: Sep. 7, 2010

(54) ION SOURCE, ION IMPLANTATION APPARATUS, AND ION IMPLANTATION METHOD

(75) Inventors: Takatoshi Yamashita, Kyoto (JP); Tadashi Ikejiri, Kyoto (JP); Keiko Kuzawa, Kyoto (JP); Hideyuki Fujiwara, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 61 days.

(21) Appl. No.: 12/233,151

(22) Filed: Sep. 18, 2008

(65) Prior Publication Data

US 2009/0078890 A1 Mar. 26, 2009

(30) Foreign Application Priority Data

Sep. 20, 2007 (JP) ............... 2007-243308

(51) Int. Cl.
*H01J 37/08* (2006.01)
*H01J 27/02* (2006.01)
*H01J 27/08* (2006.01)

(52) U.S. Cl. .................. 250/423 R; 250/482.21; 250/396 R; 250/397; 250/427; 315/111.81; 315/111.21

(58) Field of Classification Search ......... 250/423 R, 250/492.21, 396 R, 397, 427; 315/111.81, 315/111.21
See application file for complete search history.

(56) References Cited

U.S. PATENT DOCUMENTS

| 7,589,333 B2* | 9/2009 | Graf et al. ............ 250/492.21 |
| 2008/0078957 A1* | 4/2008 | Graf et al. ............ 250/492.21 |
| 2009/0001290 A1* | 1/2009 | Yamashita ............ 250/492.3 |
| 2009/0212232 A1* | 8/2009 | Yamashita et al. ...... 250/423 R |

FOREIGN PATENT DOCUMENTS

| JP | 2002-334662 | 11/2002 |
| JP | 3758667 | 1/2006 |

OTHER PUBLICATIONS

Patent Abstracts of Japan for Japanese Publication No. 2006-324050, Publication date Nov. 30, 2006 (1 page) (Corresponds to JP3758667).
Patent Abstracts of Japan for Japanese Publication No. 2002-334662, Publication date Nov. 22, 2002 (1 page).

* cited by examiner

*Primary Examiner*—Nikita Wells
(74) *Attorney, Agent, or Firm*—Osha • Liang LLP

(57) ABSTRACT

This ion source generates a ribbon-like ion beam whose dimension in the Y direction is larger than the dimension in the X direction. This ion source includes a plasma generating vessel having an ion extraction port extending in the Y direction, a plurality of cathodes arranged in a plurality of stages along the Y direction on one side in the X direction in the plasma generating vessel, a reflecting electrode arranged on the other side in the X direction in the plasma generating vessel opposite to the cathodes, and electromagnets for generating magnetic fields along the X direction in regions including the plurality of cathodes in the plasma generating vessel.

20 Claims, 17 Drawing Sheets

TOTAL ADJUSTMENT

INDIVIDUAL ADJUSTMENT

INDIVIDUAL ADJUSTMENT

NON-UNINFORMIZING ADJUSTMENT

NON-UNINFORMIZING ADJUSTMENT

ION SOURCE, ION IMPLANTATION APPARATUS, AND ION IMPLANTATION METHOD

The present invention claims priority from Japanese Patent Application No. 2007-243308 filed on Sep. 20, 2007, the entire content of which is incorporated herein by reference.

BACKGROUND OF INVENTION

1. Field of the Invention

The present invention relates to an ion source for generating a ribbon-like ion beam (may be referred to as sheet-like or belt-like, the same holds for the following description). The ion beam dimension in the Y direction in a plane substantially orthogonal to a traveling direction is larger than the dimension in the X direction substantially orthogonal to the Y direction, an ion implantation apparatus including the same ion source, and an ion implantation method in the ion implantation apparatus.

2. Description of the Related Art

FIG. 1 shows an example of a ribbon-like ion beam 2 whose dimension $W_Y$ in the Y direction in a plane substantially orthogonal to the traveling direction Z is larger than the dimension $W_X$ in the X direction substantially orthogonal to the Y direction.

In JP-A-2002-334662 (Paragraph 0002-0012, FIG. 12), a Bernas-type ion source is described in which filaments and a reflecting electrode are opposed across a longitudinal direction of an ion extraction slit, and in a direction along an axis connecting these (that is, along the longitudinal direction of the ion extraction slit), an applied magnetic field is described. By setting the longitudinal direction of the ion extraction slit of this ion source as the Y direction, it is possible that a ribbon-like ion beam with a larger dimension in the Y direction as described above may be generated.

To realize uniform ion implantation into, for example, a large-sized target by using the above-described ion source, it is necessary that the dimension of the ribbon-like ion beam to be generated (extracted) from the ion source is increased and the uniformity of the beam current density distribution in the Y direction is improved. Therefore, it is necessary to increase the dimension in the Y direction of a plasma generating vessel of the ion source and improve the uniformity of the plasma density distribution in the Y direction in the plasma generating vessel.

However, if the plasma generating vessel becomes larger, the plasma density distribution in the plasma generating vessel inevitably becomes nonuniform, so that it is difficult to extract an ion beam with a uniform beam current density distribution in the Y direction.

If it is attempted to perform control to make uniform the plasma density distribution in the plasma generating vessel by some method, in a related ion source, a magnetic field is applied along the Y direction and the influence of the magnetic field spreads over in the Y direction, so that it is difficult to partially control the plasma density in the Y direction, and therefore, it is difficult to improve the uniformity of the plasma density distribution in the Y direction. In other words, the magnetic field along the Y direction makes it difficult to control the plasma density distribution in the Y direction. However, if the application of the magnetic field is stopped, the electron confinement by the magnetic fields becomes impossible, so that the plasma generation efficiency lowers.

SUMMARY OF INVENTION

In one or more embodiments of the invention, an ion source is provided with a partial control of a plasma density in a Y direction in a plasma generating vessel and realizes improvement in a uniformity of a beam current density distribution in the Y direction of a ribbon-like ion beam in the Y direction and a predetermined nonuniform distribution.

In another embodiment of the invention, an ion implantation apparatus is provided to improve the uniformity of the beam current density distribution in the Y direction of the ribbon-like ion beam in an implantation chamber.

In still another embodiment of the invention, the ion implantation apparatus is provided to form a predetermined nonuniform beam current density distribution in the Y direction of the ribbon-like ion beam in the implantation chamber.

In still another embodiment of the invention, an ion implantation method is provided to realize formation of a nonuniform dose amount distribution in a plane of a target by using the ion implantation apparatus capable of realizing the predetermined nonuniform distribution.

A first ion source of the present invention generates a ribbon-like ion beam having a dimension in the Y direction in a plane substantially orthogonal to a traveling direction larger than a dimension in the X direction substantially orthogonal to the Y direction, including: a plasma generating vessel for generating plasma inside, which commonly serves as an anode and a gas is introduced inside, and has an ion extraction port extending in the Y direction; one or more cathodes which are provided on at least one side in the X direction of the plasma generating vessel and generate the plasma by ionizing the gas by generating discharge inside the plasma generating vessel by emitting electrons into the plasma generating vessel; one or more reflecting electrodes which are arranged at least on the other side in the X direction inside the plasma generating vessel opposite to the cathodes, and are set to a negative potential or floating potential with respect to the plasma generating vessel and reflect electrons inside the plasma generating vessel; and a plurality of electromagnets which generate magnetic fields along the X direction inside the plasma generating vessel and are arranged in a plurality of stages along the Y direction.

In this first ion source, the movable range of electrons in the plasma generating vessel between the cathode and the reflecting electrode is limited mainly to a direction along the X direction by magnetic fields along the X direction, so that electron movements in the Y direction are reduced. Therefore, the influence of the electrons confined by the magnetic fields in each stage on plasma generation of other portions is reduced. In addition, a plurality of electromagnets are arranged in a plurality of stages along the Y direction and the intensities of the magnetic fields of the respective stages to be generated from the electromagnets in the stages may be adjusted, so that the electron confinement effects by the magnetic fields in the respective stages and plasma generation effects by the electrons may be individually adjusted. As a result, the plasma density in the Y direction in the plasma generating vessel may be partially controlled.

A second ion source of the present invention generates a ribbon-like ion beam having a dimension in the Y direction in a plane substantially orthogonal to a traveling direction larger than a dimension in the X direction substantially orthogonal to the Y direction, including: a plasma generating vessel for generating plasma inside, which commonly serves as an anode and a gas is introduced inside, and has an ion extraction port extending in the Y direction; a plurality of cathodes which are provided on at least one side in the X direction of the plasma generating vessel and generate the plasma by ionizing the gas by generating discharge inside the plasma generating vessel by emitting electrons into the plasma generating vessel; one or more reflecting electrodes which are arranged at least on the other side in the X direction inside the plasma generating vessel opposite to the cathodes, and are set to a negative potential or floating potential with respect to the plasma generating vessel and reflect electrons inside the plasma generating vessel; and electromagnets for generating magnetic fields along the X direction, provided in regions including the plurality of cathodes in the plasma generating vessel.

In this second ion source, the movable range of electrons in the plasma generating vessel between the cathode and the reflecting electrode is limited mainly to a direction along the X direction by magnetic fields along the X direction, so that electron movements in the Y direction are reduced. Therefore, the influence of the electrons confined by the magnetic fields on plasma generation of other portions is reduced. In addition, a plurality of cathodes are arranged in a plurality of stages along the Y direction and the quantities of electrons to be emitted from the cathodes in the respective stages may be adjusted, so that the plasma generation effects by the electrons in the respective stages may be individually adjusted. As a result, the plasma density in the Y direction in the plasma generating vessel may be partially controlled.

A first ion implantation apparatus of the present invention includes: the first ion source; one or more cathode power supplies for emitting electrons by respectively heating the cathodes of the ion source; a plurality of exciting power supplies for supplying a DC exciting current to each electromagnet of the ion source; a beam measuring device which measures a beam current density distribution in the Y direction of the ion beam in an implantation chamber for making the ion beam generated from the ion source incident on a target; and a control device which has a control function of making the beam current density distribution to be measured with the beam measuring device more uniform by controlling the intensities of the magnetic fields to be generated from the electromagnets by controlling the exciting power supplies based on measurement information from the beam measuring device.

A second ion implantation apparatus of the present invention includes: the second ion source; a plurality of cathode power supplies for emitting electrons by respectively heating the cathodes of the ion source; exciting power supplies for supplying DC exciting currents to the electromagnets of the ion source; a beam measuring device which measures a beam current density distribution in the Y direction of the ion beam in an implantation chamber for making the ion beam generated from the ion source incident on a target; and a control device having a control function of making the beam current density distribution to be measured with the beam measuring device more uniform by controlling quantities of electrons to be emitted from the respective cathodes by controlling the cathode power supplies based on measurement information from the beam measuring device.

A third ion implantation apparatus of the present invention includes: the first ion source; one or more cathode power supplies for emitting electrons by respectively heating the cathodes of the ion source; a plurality of exciting power supplies for supplying DC exciting currents to the electromagnets of the ion source; a beam measuring device which measures a beam current density distribution in the Y direction of the ion beam in an implantation chamber for making the ion beam generated from the ion source incident on a target; and a control device having a control function of making a beam current density distribution to be measured with the beam measuring device closer to a predetermined nonuniform distribution including a plurality of regions with different beam current densities by controlling the intensities of the magnetic fields to be generated from the electromagnets by controlling the exciting power supplies based on measurement information from the beam measuring device.

A fourth ion implantation apparatus of the present invention includes: the second ion source; a plurality of cathode power supplies for emitting electrons by respectively heating the cathodes of the ion source; exciting power supplies for supplying DC exciting currents to the electromagnets of the ion source; a beam measuring device which measures a beam current density distribution in the Y direction of the ion beam in an implantation chamber for making the ion beam generated from the ion source incident on a target; and a control device having a control function of making a beam current density distribution to be measured with the beam measuring device closer to a predetermined nonuniform distribution including a plurality of regions with different beam current densities by controlling the quantities of electrons to be emitted from the respective cathodes by controlling the cathode power supplies based on measurement information from the beam measuring device.

According to one of the ion implantation methods of the present invention, in the third or fourth ion implantation apparatus, a nonuniform dose amount distribution is formed in a plane of a target by either mechanically moving the target along the X direction across the ion beam from the ion source or rotating the target around its center.

According to the first aspect of the invention, the movable range of electrons in the plasma generating vessel between the cathode and the reflecting electrode is limited mainly to a direction along the X direction by magnetic fields along the X direction, so that electron movements in the Y direction are reduced. Therefore, the influence of electrons confined by the magnetic fields in each stage on the plasma generation of other portions is reduced. In addition, a plurality of electromagnets are arranged in a plurality of stages along the Y direction and the intensities of the magnetic fields in the respective stages to be generated from the electromagnets in the respective stages may be adjusted, so that the electron confinement effects by the magnetic fields in the respective stages and plasma generation effects by the electrons may be individually adjusted. As a result, plasma density in the Y direction in the plasma generating vessel may be partially controlled.

As a result, for example, improvement in the uniformity of the beam current density distribution in the Y direction of a ribbon-like ion beam and predetermined nonuniform distribution may be realized.

According to the second aspect of the invention, the electromagnets are paired by sandwiching the plasma generating vessel in the X direction, so that spread in the Y direction of the magnetic fields in the plasma generating vessel may be reduced. As a result, influence of electrons confined by the magnetic fields in each stage on plasma generation of other portions may be reduced and the effect of partially controlling plasma density in the Y direction in the plasma generating vessel may be made more reliable.

According to the third aspect of the invention, the movable range of electrons in the plasma generating vessel between the cathode and the reflecting electrode is limited mainly to a direction along the X direction by magnetic fields along the X direction, so that electron movements in the Y direction are reduced. Therefore, the influence of electrons confined by the magnetic fields on the plasma generation of other portions is reduced. In addition, cathodes are arranged in a plurality of stages along the Y direction and the quantities of electrons to be emitted from the cathodes in the respective stages may be adjusted, so that the plasma generation effects by the electrons in the respective stages may be individually adjusted. As a result, plasma density in the Y direction in the plasma generating vessel may be partially controlled.

As a result, an improvement in the uniformity of the beam current density distribution in the Y direction of the ribbon-like ion beam and predetermined nonuniform distribution may be realized.

According to the fourth aspect of the invention, the electromagnets have racetrack coils whose dimensions in the Y direction are larger than their dimensions in the X direction, and are paired by sandwiching the plasma generating vessel in the X direction, so that the spread of the magnetic fields in the Y direction in the plasma generating vessel may be reduced. As a result, influence of electrons confined by the magnetic fields on plasma generation of other portions is made smaller and the effect of partially controlling the plasma density in the Y direction in the plasma generating vessel may be made more reliable.

According to the fifth aspect of the invention, a control device having a control function of making the beam current density distribution to be measured with the beam measuring device more uniform by controlling the intensities of magnetic fields to be generated from the electromagnets by controlling the exciting power supplies based on measurement information from the beam measuring device is provided, so that uniformity of the beam current density distribution in the Y direction of a ribbon-like ion beam in the implantation chamber may be improved.

According to the sixth aspect of the invention, the control device has a total adjusting function and an individual adjusting function, so that an average of a total beam current density distribution in the Y direction of the ribbon-like ion beam in the implantation chamber may be made to fall within a first permissible range, and averages of the beam current density distributions of the groups in the Y direction may be made to fall within a second permissible range. Therefore, the average of the beam current density distribution in the Y direction of the ion beam may be made closer to the set value, and the uniformity of the beam current density distribution may be more reliably improved.

According to the seventh aspect of the invention, the apparatus includes a control device which has a control function of making a beam current density distribution to be measured with the beam measuring device more uniform by controlling the quantities of electrons to be emitted from the respective cathodes by controlling the cathode power supplies based on measurement information from the beam measuring device, so that the beam current density distribution in the Y direction of the ribbon-like ion beam in the implantation chamber may be improved in uniformity.

According to the eighth aspect of the invention, the apparatus includes a control device which has a control function of making the beam current density distribution to be measured with the beam measuring device closer to a predetermined nonuniform distribution including a plurality of regions with different beam current densities by controlling the intensities of the magnetic fields to be generated from the electromagnets by controlling the exciting power supplies based on measurement information from the beam measuring device, so that the beam current density distribution in the Y direction of the ribbon-like ion beam in the implantation chamber may be set to a predetermined nonuniform distribution.

According to the ninth aspect of the invention, the averages of the beam current density distributions of the groups in the Y direction may be made to fall within permissible ranges with respect to a plurality of set values including set values different from each other by the control device, so that the beam current density distribution in the Y direction of the ribbon-like ion beam in the implantation chamber may be more reliably set to a predetermined nonuniform distribution.

According to the tenth aspect of the invention, the apparatus includes a control device which has a control function of making the beam current density distribution to be measured with the beam measuring device closer to a predetermined nonuniform distribution including a plurality of regions with different beam current densities by controlling the quantities of electrons to be emitted from the respective cathodes by controlling the cathode power supplies based on measurement information from the beam measuring device, so that the beam current density distribution in the Y direction of the ribbon-like ion beam in the implantation chamber may be set to the predetermined nonuniform distribution.

According to the eleventh aspect of the invention, by using an ion implantation apparatus capable of realizing the predetermined nonuniform beam current density distribution, a nonuniform dose amount distribution in a plane of a target may be formed. In other words, a plurality of implantation regions with different dose amounts may be formed within a plane of one target. As a result, for example, characteristic correction and characteristic changes of a semiconductor device by means of ion implantation in a specific region inside the semiconductor device formed in the plane of the target may be flexibly realized.

Other aspects and advantages of the invention will be apparent from the following description and the appended claims.

DESCRIPTION OF EXEMPLARY EMBODIMENTS

(1) Ion Source

Figure 2:
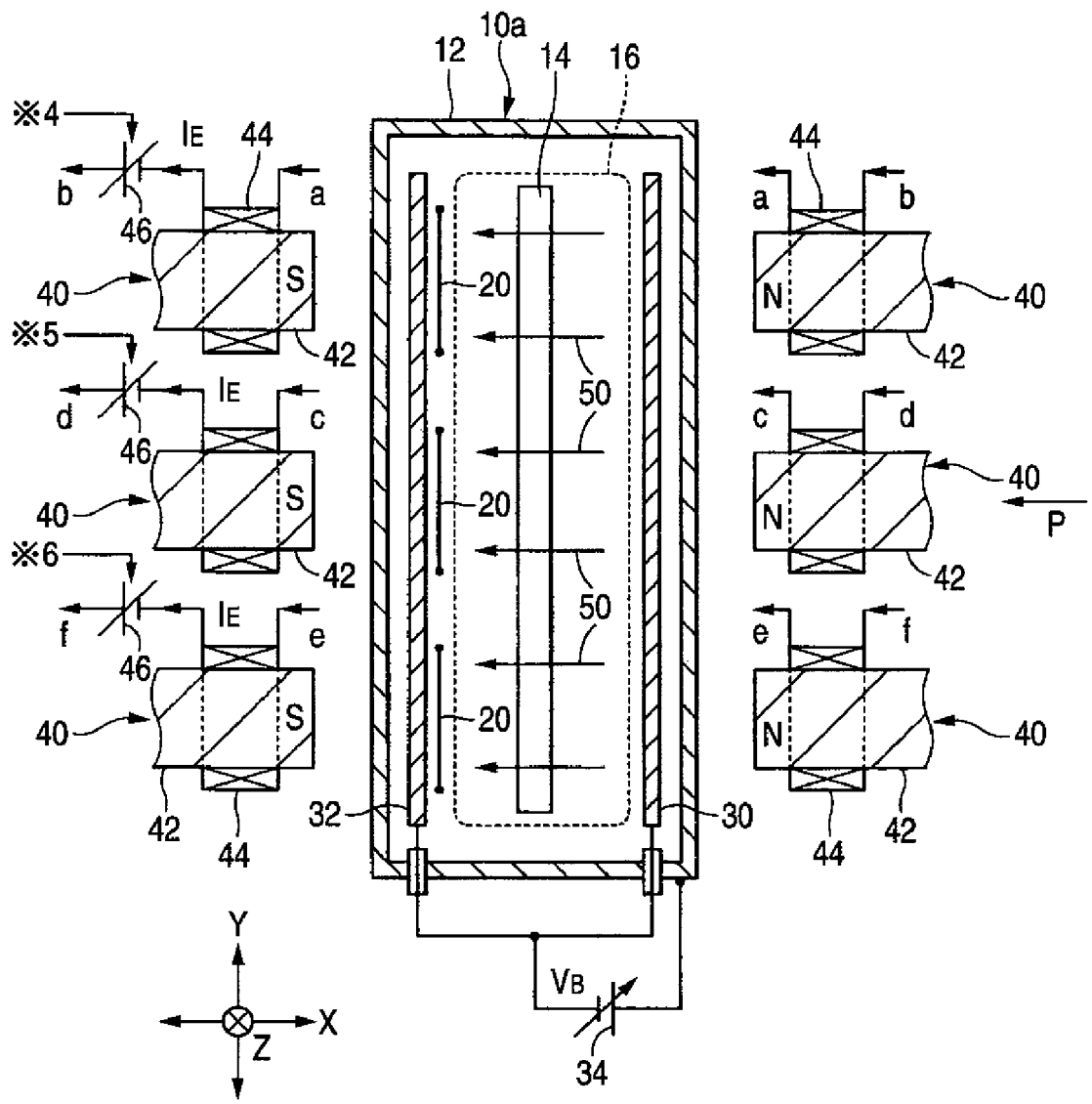
FIG. 2 is a sectional view of an embodiment of an ion source in an ion beam traveling direction.
Figure 3:
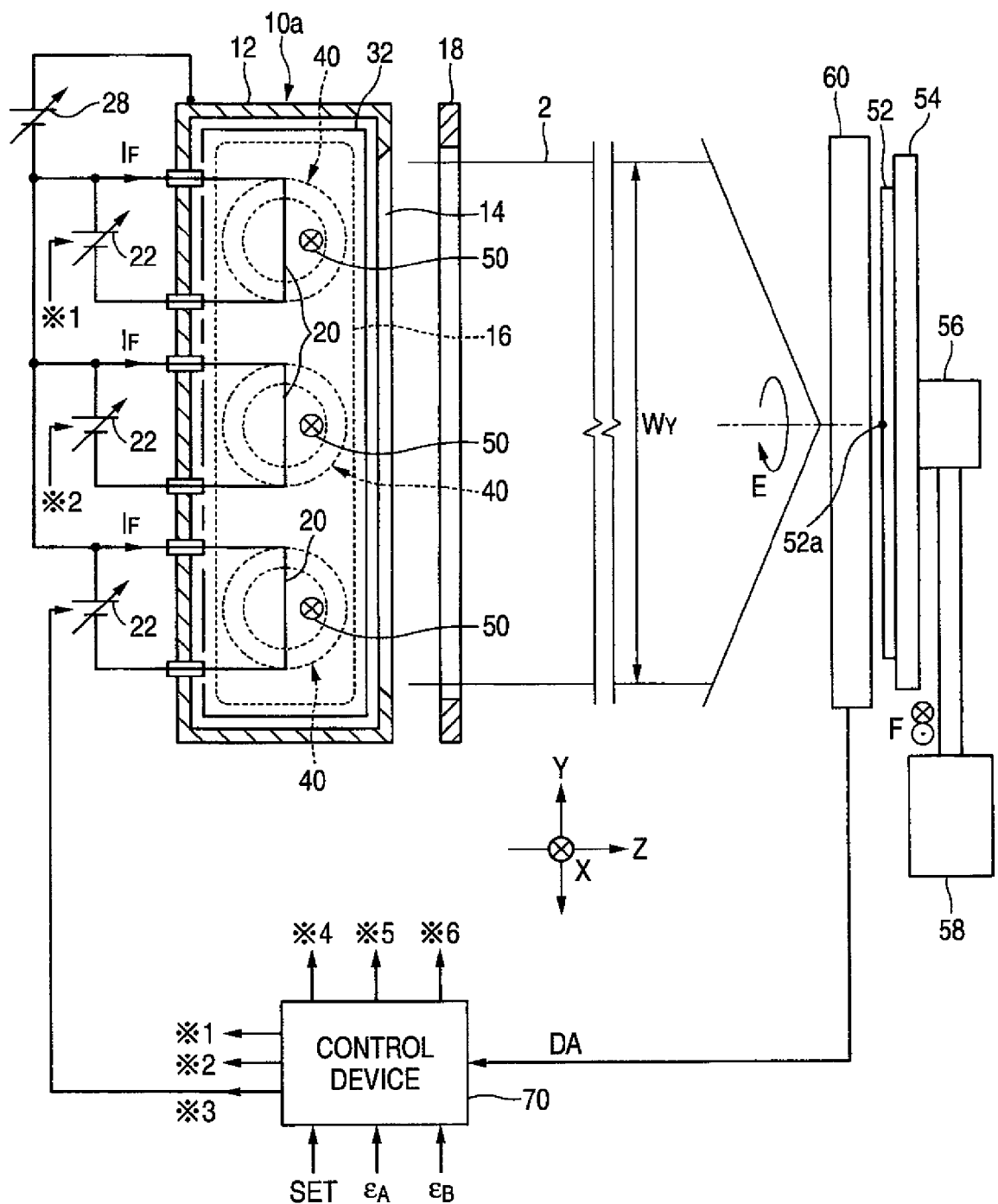
FIG. 3 is a drawing showing the embodiment of an ion implantation apparatus including the ion source of FIG. 2, showing the ion source in a section along the arrow P of FIG. 2.

FIG. 2 is a sectional view of an embodiment of the ion source of the present invention in an ion beam traveling direction. FIG. 3 is a drawing showing an embodiment of an ion implantation apparatus including the ion source of FIG. 2, and the ion source is shown in the section along the arrow P of FIG. 2. The ion implantation apparatus will be described in detail later.

Figure 1:
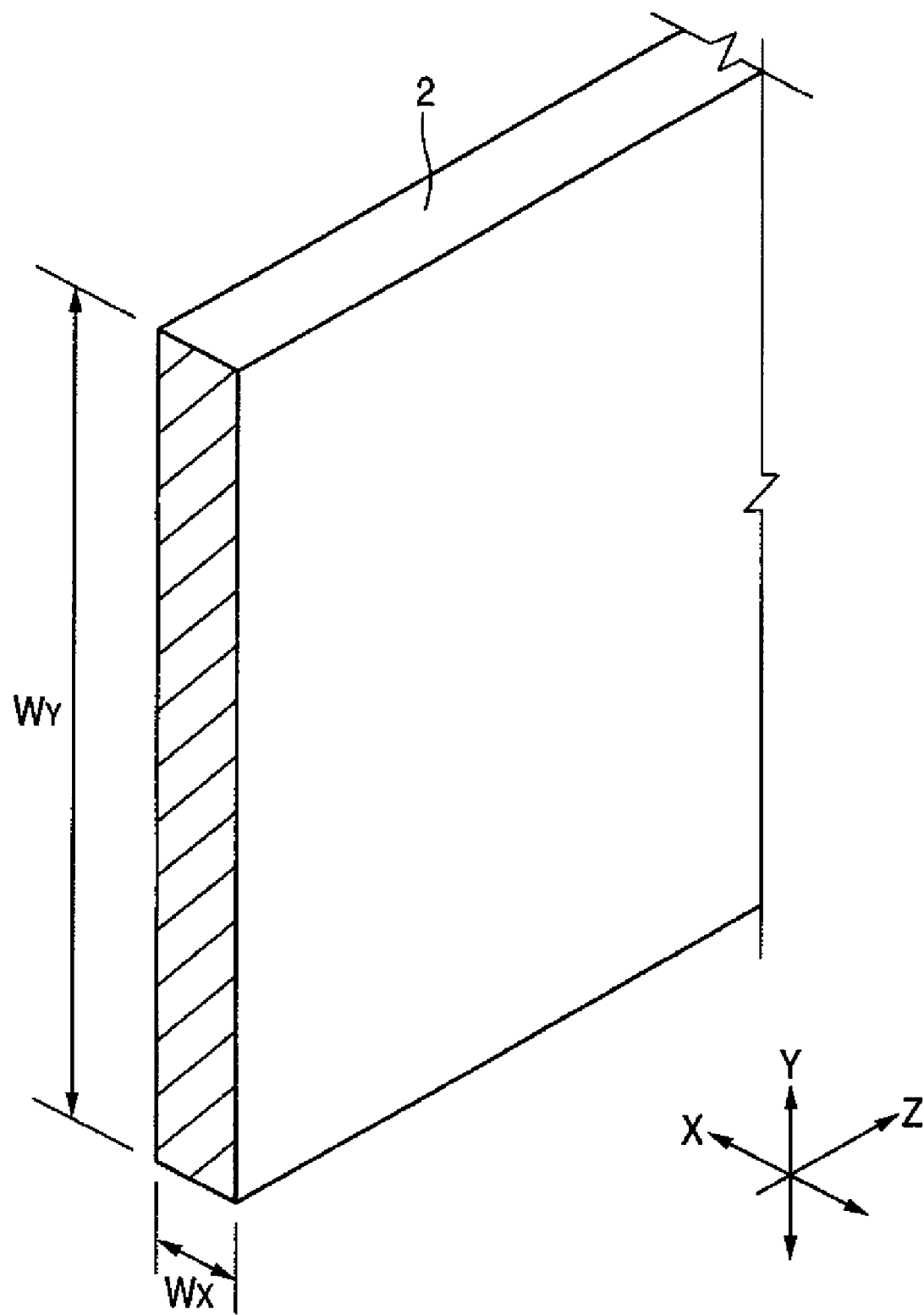
FIG. 1 is a perspective view showing an example of a ribbon-like ion beam.
Figure 4:
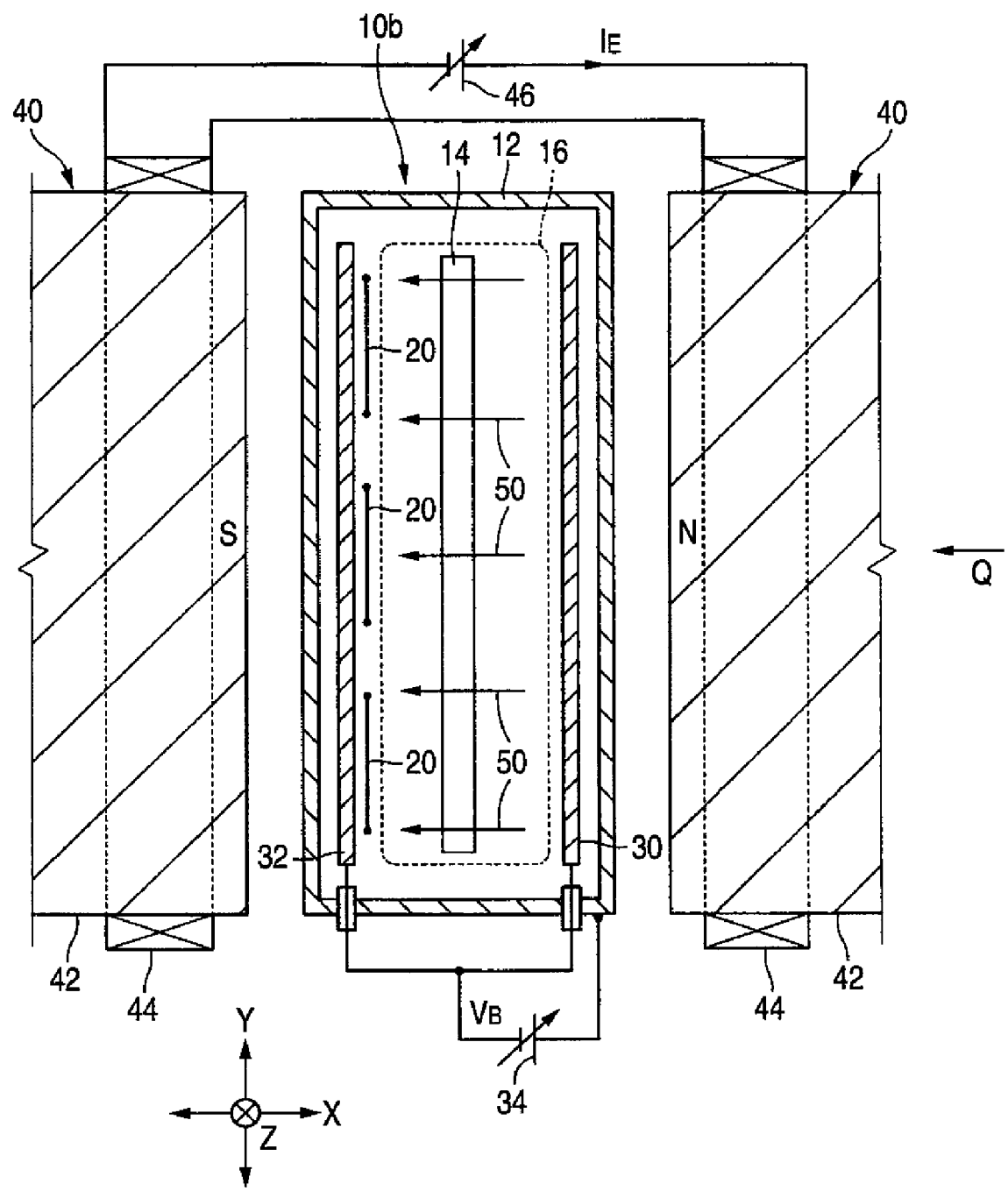
FIG. 4 is a sectional view of another embodiment of the ion source in the ion beam traveling direction.
Figure 5:
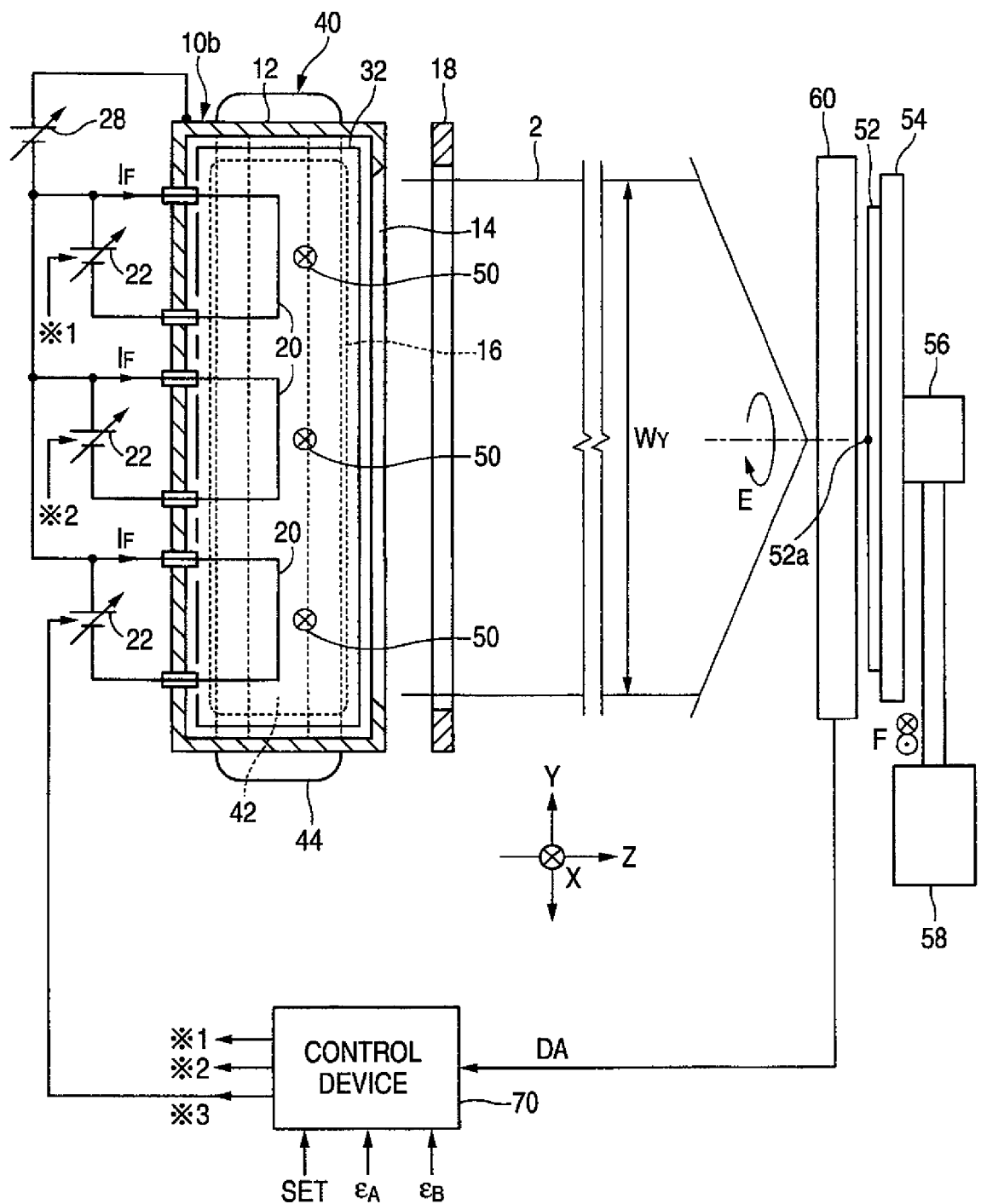
FIG. 5 is a drawing showing an embodiment of an ion implantation apparatus including the ion source of FIG. 4, showing the ion source in a section along the arrow Q.

This ion source (first ion source) 10a generates, for example, a ribbon-like ion beam 2 whose dimension $W_Y$ in the Y direction in a plane substantially orthogonal to the traveling direction Z is larger than the dimension $W_X$ in the X direction substantially orthogonal to the Y direction as shown in FIG. 1. The ion source (second ion source) 10b shown in FIG. 4 and FIG. 5 is similar to this.

"Ribbon-like" does not mean thin like paper or cloth. For example, the dimension $W_X$ in the X direction of the ion beam 2 is about 5 to 10 cm, and the dimension $W_Y$ in the Y direction is about 35 to 50 cm. However, the dimensions are not limited to these.

The ion source 10a includes a plasma generating vessel 12 which is for generating plasma 16 inside and commonly serves as an anode. The plasma generating vessel 12 has, for example, a rectangular parallelepiped box shape. A gas (including vapor) as a raw material for generating plasma 16 is introduced into the plasma generating vessel 12.

The plasma generating vessel 12 has an ion extraction port 14 extending in the Y direction. The ion extraction port 14 is, for example, an ion extraction slit, and has a shape corresponding to a section of the ion beam 2.

On one side (left side in FIG. 2) in the X direction inside the plasma generating vessel 12, a plurality of cathodes 20 which generate plasma 16 by ionizing the gas by generating discharge inside the plasma generating vessel 12 by emitting electrons (thermions) into the plasma generating vessel 12 are provided. The number of cathodes 20 is three in the illustrated example, however, it is not limited to three. The respective cathodes 20 are directly heated cathodes, that is, filaments.

Each cathode 20 has a bar shape (linear shape) in this embodiment, and is in a C shape in a lateral view (see FIG. 3), and the central sides of the cathodes are arranged in a plurality of stages along the Y direction so as to extend along the Y direction.

To each cathode 20, a cathode power supply 22 for emitting electrons by heating the cathode is connected. The respective cathode power supplies 22 may be DC power supplies as illustrated, or may be AC power supplies. The respective cathode power supplies 22 may control (increase or reduce) individually currents $I_F$ to be supplied to the respective cathodes 20 according to control from, for example, a control device 70 described later. Accordingly, the quantities of electrons to be emitted from the respective cathodes 20 may be controlled.

Between the cathodes 20 and the plasma generating vessel 12, a DC arc power supply 28 which generates plasma 16 by ionizing a gas introduced into the plasma generating vessel 12 and generating arc discharge inside the plasma generating vessel 12 by accelerating thermions emitted from the respective cathodes 20 is connected by setting the cathodes 20 as a negative electrode side. The arc power supply 28 may be shared by the plurality of cathodes 20 as in this embodiment, or individually provided between each cathode 20 and the plasma generating vessel 12.

A plate-like first reflecting electrode 30 is arranged on the other side (right side in FIG. 2) in the X direction inside the plasma generating vessel 12 opposite to the cathodes 20. Further, as in this embodiment, a plate-like second reflecting electrode 32 may also be arranged behind the cathodes 20 in the X direction. Each of the reflecting electrodes 30 and 32 has a size substantially entirely covering one side surface inside the plasma generating vessel 12 in this embodiment.

The reflecting electrodes 30 and 32 are electrically insulated from the plasma generating vessel 12 and the respective cathodes 20. The reflecting electrodes 30 and 32 may be set to a negative potential with respect to the plasma generating vessel 12 by applying a negative bias voltage $V_B$ thereto based on the plasma generating vessel 12 from the bias power supply 34 as in this embodiment, or may be set to a floating potential without electrically connecting these to anywhere. Even when set to a floating potential, thermions which have been emitted mainly from the cathodes 20 and have energy as high as the output voltage of the arc power supply 28 are made incident on the reflecting electrodes 30 and 32 and charges these to a negative potential.

The reflecting electrodes 30 and 32 are set to a negative potential with respect to the plasma generating vessel 12, and function to reflect (repel) the electrons inside the plasma generating vessel 12 (mainly, electrons from the cathodes 20). Therefore, when the reflecting electrodes 30 and 32 are provided, electrons reciprocate between the reflecting electrodes 30 and 32 while rotating in magnetic fields 50 around the direction of the magnetic fields 50 described later, and as a result, collision probability of the electrons with the raw material gas increases and the ionization efficiency of the gas increases, so that the generation efficiency of the plasma 16 increases. When the reflecting electrode 32 is not provided, electrons reciprocate between the cathodes 20 and the reflecting electrode 30.

By only providing the reflecting electrode 30 opposed to the cathodes 20, the effects of the electron reflection, the improvement in ionization efficiency of the gas, and the improvement in generation efficiency of the plasma 16 may be obtained, however, as in the present embodiment, by additionally providing the reflecting electrode 32 behind the cathodes 20, the effects may be further improved.

Further, this ion source 10a generates (applies) magnetic fields 50 along the X direction inside the plasma generating vessel 12, and includes a plurality of electromagnets 40 arranged in a plurality of stages along the Y direction. The direction of the magnetic fields 50 may be opposite to those of the illustrated example (the same holds for the ion source 10b described later). The number of electromagnets 40 is three in the illustrated example, however, it is not limited to this. The electromagnets 40 are preferably provided corresponding to the positions of the cathodes 20 when the plurality of cathodes 20 are provided as in this embodiment.

Each electromagnet 40 has a magnetic pole 42 and a coil 44 wound around the magnetic pole.

The electromagnets 40 are paired by sandwiching the plasma generating vessel 12 in the X direction. The magnetic poles 42 of the paired electromagnets 40 are magnetically coupled to each other by a yoke (not shown, the same holds for the following description). All magnetic poles 42 may be magnetically coupled by the yoke.

To the electromagnets 40, DC exciting currents $I_E$ are supplied from a plurality of exciting power supplies (DC power supplies) 46. In this embodiment, the coils 44 of the paired electromagnets 40 are connected in series (the portions indicated by the same reference symbol among the reference symbols a through f in FIG. 2 are electrically connected to each other), and each exciting power supply 46 is shared by the paired electromagnets 40. Instead of this, the exciting power supply 46 may be provided for each electromagnet 40.

The respective exciting power supplies 46 may control the exciting currents $I_E$ to be supplied to the electromagnets 40, respectively, according to control from, for example, a control device 70 described later.

Near the outlet of the ion extraction port 14, an extracting electrode system 18 for extracting ion beams 2 from the plasma 16 inside the plasma generating vessel 12 is provided. The extracting electrode system 18 is not limited to the illustrated one electrode.

For example, between the plasma generating vessel 12 and the electromagnets 40, a vacuum vessel (also called ion source chamber) made of a nonmagnetic material is provided, however, the illustration thereof is omitted herein. It is also omitted in FIG. 4 and FIG. 5, etc.

In this ion source 10a which is different from the above-described related ion source, the magnetic fields 50 are applied in a direction along the X direction. Therefore, the movable range of electrons inside the plasma generating vessel 12 between the cathodes 20 and the reflecting electrode 30 or between the reflecting electrodes 30 and 32 is limited mainly to a direction along the X direction by the magnetic fields 50 along the X direction, so that the electron movements in the Y direction are reduced. This is because electrons rotate around the magnetic fields (Larmor precession), and they may move in the direction along the magnetic fields (that is, X direction), however, they hardly move in a direction across the magnetic fields 50 (that is, Y direction). It was also proved by electron orbit simulation that electrons gather mainly between the respective cathodes 20 and the reflecting electrode 30 and create groups equal to the number of stages of the cathodes 20 or electromagnets 40. Therefore, the influence of electrons confined by the magnetic fields 50 applied by the electromagnets 40 in the respective stages on plasma generation is reduced of other portions.

In addition, a plurality of electromagnets 40 are arranged in a plurality of stages along the Y direction, and the intensities of the magnetic fields 50 in the respective stages generated from the electromagnets 40 in the respective stages may be adjusted, so that the electron confinement effects by the magnetic fields 50 in the respective stages and plasma generation effects by the electrons may be individually adjusted. As a result, the plasma density in the Y direction inside the plasma generating vessel 12 may be partially controlled.

For example, when the magnetic fields 50 are weakened, the Larmor radius of electrons increases and the electron density lowers, so that electrons hardly collide with gas molecules, and due to the large Larmor radius, the ratio of electrons colliding with a structure such as a wall face of the plasma generating vessel 12 and vanishing increases, and therefore, the plasma generation efficiency lowers and the plasma density lowers. On the contrary, when the magnetic fields 50 are strengthened to a certain degree, the Larmor radius of electrons becomes smaller and the electron density increases, so that electrons easily collide with gas molecules, and due to the small Larmor radius, the ratio of electrons colliding with a structure such as a wall face of the plasma generating vessel 12 and vanishing decreases, and therefore, the plasma generation efficiency increases and the plasma density becomes higher. In addition, as described above, the movable range of electrons is limited to the X direction by the magnetic fields 50 and movements in the Y direction are less, so that the influence of partial increase or decrease in plasma density on plasma densities of other portions is small.

Mainly, according to the above-described effects, by adjusting the intensities of the magnetic fields 50 in the respective stages to be generated from the electromagnets 40 in the respective stages, the plasma density in the Y direction inside the plasma generating vessel 12 may be partially controlled.

As a result, uniformity of the beam current density distribution in the Y direction of the ribbon-like ion beam 2 to be extracted from this ion source 10a may be improved. Alternatively, on the contrary, by intentionally controlling the beam current density distribution so as to become nonuniform, a predetermined nonuniform beam current density distribution may be realized. This predetermined nonuniform distribution may be called a controlled nonuniform distribution (the same holds for the description below).

In this ion source 10a, the electromagnets 40 are paired by sandwiching the plasma generating vessel 12 in the X direction, so that the spread of the magnetic fields 50 in the Y direction inside the plasma generating vessel 12 may be reduced. As a result, the influence of electrons confined by the magnetic fields 50 in the respective stages on plasma generation of other portions may be further reduced and a more reliable effect of partial controlling the plasma density in the Y direction inside the plasma generating vessel 12 may be obtained.

Figure 6:
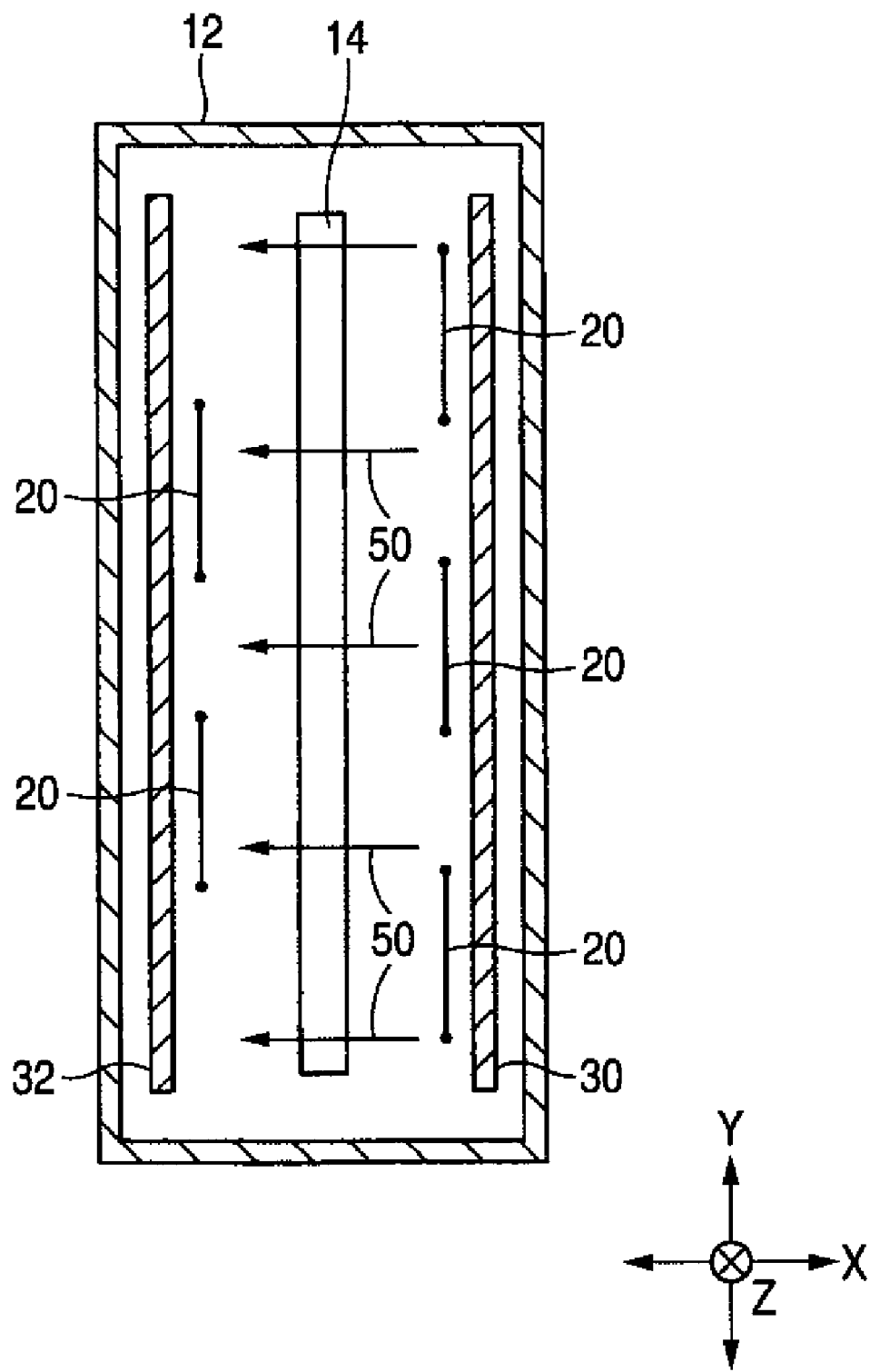
FIG. 6 is a drawing showing another example of arrangement of cathodes.

The number, the shape, and arrangement, etc., of cathodes 20, are not limited to those of the above-described embodiment. For example, as in the example of FIG. 6, it is also allowed that a plurality of cathodes 20 are alternately arranged on one side and the other side in the X direction inside the plasma generating vessel 12 so as to sandwich the ion extraction port 14 in the X direction. The same holds for the ion source 10b described later. Alternatively, in this ion source 10a, different from the ion source 10b described later, the electron confinement effects by the magnetic fields 50 in the respective stages and the plasma generation effects by the electrons are individually adjusted by adjusting the intensities of the magnetic fields 50 in the respective stages, so that the necessary number of cathodes 20 is one or more. For example, the cathodes 20 may be one cathode (for example, filament) long in the Y direction like a combination of the three cathodes shown in FIG. 2.

Of course, as in the case of the ion source 10a of this embodiment, it is also allowed that a plurality of cathodes 20 are arranged in a plurality of stages along the Y direction, and control of the intensities of the magnetic fields 50 to be generated from the electromagnets 40 and control of the quantities of electrons to be emitted from the respective cathodes 20 are both used to partially control the plasma density distribution in the Y direction inside the plasma generating vessel 12. Accordingly, the number of control targets increases, so that the plasma density may be partially controlled.

As the respective cathodes 20, instead of the directly heated cathodes (filaments) as in the case of the above-described embodiment, indirectly heated cathodes may be used. The same holds for the ion source 10b described later. An example of the indirectly heated cathodes is shown in FIG. 7.

Figure 7:
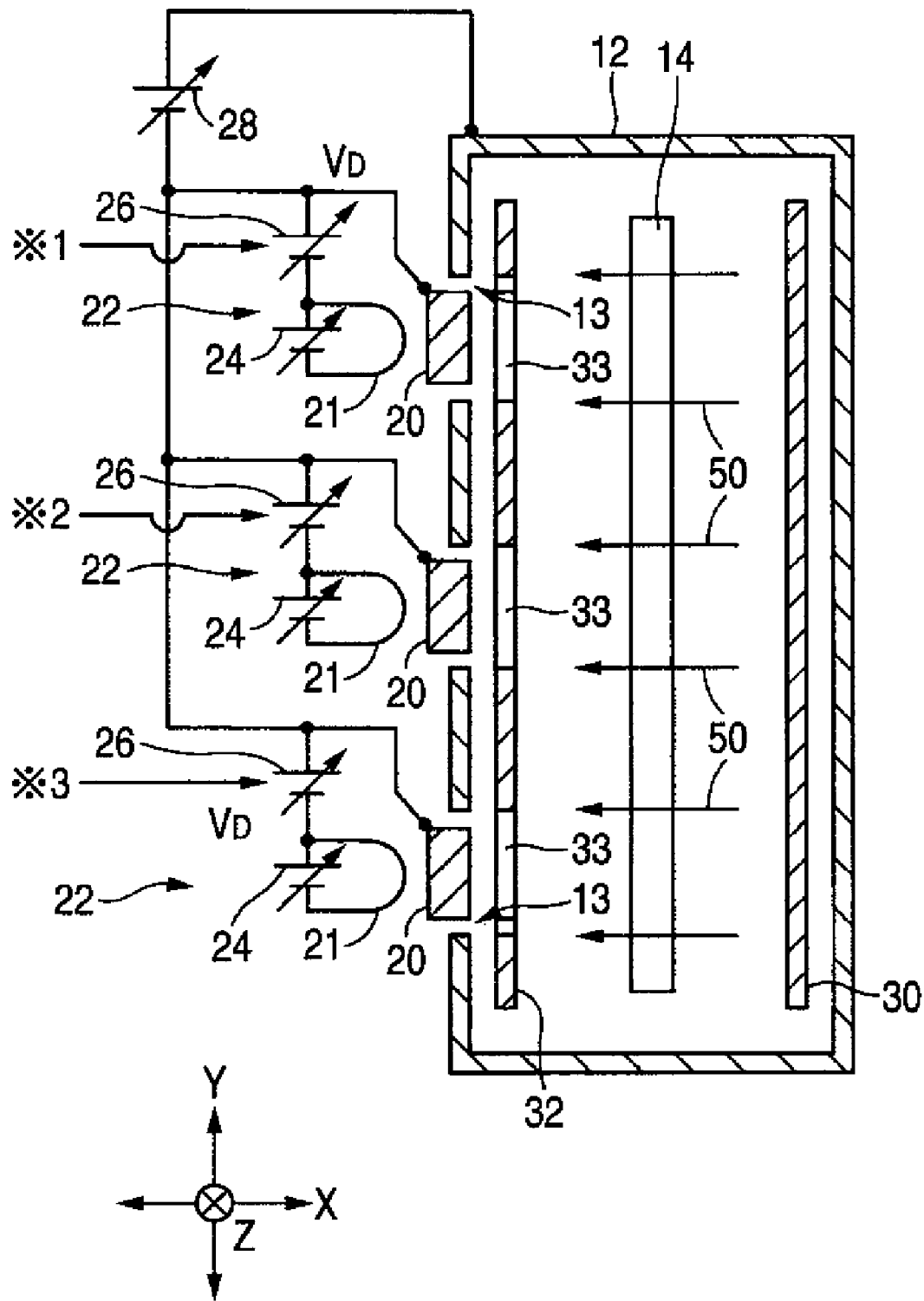
FIG. 7 is a drawing showing an example of indirectly heated cathodes.

In the example shown in FIG. 7, the respective cathodes 20 are provided at the portions of a plurality of holes 13 made in the wall face of the plasma generating vessel 12. In the reflecting electrode 32, corresponding to the respective cathodes 20, holes 33 through which electrons emitted from the respective cathodes 20 pass are made, respectively. Behind the respective cathodes 20, filaments 21 for emitting electrons (thermions) from the respective cathodes 20 into the plasma generating vessel 12 by respectively heating the cathodes 20 are provided, respectively. Filament power supplies 24 for heating the filaments 21 are connected to the respective filaments 21. The filament power supplies 24 may be DC power supplies as illustrated, or may be AC power supplies.

Between the respective filaments 21 and the cathodes 20, DC bombardment power supplies 26 which accelerate the thermions emitted from the filaments 21 toward the cathodes 20 and heat the cathodes 20 by using bombardment of thermions are connected by setting the cathodes 20 as a positive electrode side. The bombardment power supplies 26 and the filament power supplies 24 constitute cathode power supplies 22, respectively.

By increasing or reducing at least one of the outputs of the power supplies 24 and 26, the quantities of electrons to be emitted from the respective cathodes 20 may be controlled. For example, as in this example, it is possible that the output voltages $V_D$ of the bombardment power supplies 26 are individually controlled (increased or reduced) by the control device 70.

The arc power supply 28 is as described above.

A more detailed structure including respective cathodes 20 and filaments 21 arranged with respect to the plasma generating vessel 12 is schematically shown in FIG. 7, however, a known structure described in, for example, Japanese Patent Publication No. 3758667 may be adopted.

The respective cathodes 20 and the filaments 21 may be positioned inside the plasma generating vessel 12. For example, when the reflecting electrode 32 is provided, similar to the cathodes 20 shown in FIG. 2, the respective cathodes 20 may be positioned at a further inner side than the reflecting electrode 32.

The numbers, shapes, and arrangements, etc., of the reflecting electrodes 30 and 32 are not limited to the above-described embodiment. For example, as described above, the reflecting electrode 32 behind the cathodes 20 are not necessarily provided. The reflecting electrode 30 (and the reflecting electrode 32 when it is provided) may be divided into a plurality of reflecting electrodes corresponding to the respective cathodes 20. In this case, a bias voltage $V_B$ may be individually applied to the plurality of reflecting electrodes from a plurality of bias power supplies 34. When the reflecting electrodes 30 and 32 are not divided, the plasma density may be totally adjusted by a bias voltage $V_B$ to be applied thereto. When the reflecting electrodes 30 and 32 are divided and the bias voltage $V_B$ is individually applied thereto, the plasma density may be partially controlled by the respective bias voltages $V_B$. This control may be additionally used for controlling the plasma density. The same holds for the ion source 10b described later.

As gas introduction into the plasma generating vessel 12, a gas maybe introduced from one point or a gas may be introduced from a plurality of gas introduction ports arranged in a plurality of stages along the Y direction via flow controllers. When the gas is introduced from one point, the plasma density may be totally adjusted by the gas flow rate. When the gas is introduced from a plurality of gas introduction ports, the plasma density may be partially controlled by the respective gas flow rates. This control may be additionally used for controlling the plasma density. The same holds for the ion source 10b described later.

FIG. 4 is a sectional view of another embodiment of the ion source of the present invention in an ion beam traveling direction. FIG. 5 is a drawing showing an embodiment of an ion implantation apparatus including the ion source shown in FIG. 4, and the ion source is shown in a section along the arrow Q of FIG. 4. The component identical to or equivalent to that in the ion source 10a shown in FIG. 2 and FIG. 3 is attached with the same reference numeral, and hereinafter, differences from the ion source 10a are mainly described. The ion implantation apparatus will be described in detail later.

This ion source 10b includes a plurality of cathodes 20 arranged in a plurality of stages along the Y direction inside the plasma generating vessel 12. The respective cathodes 20 are as described above.

Further, in regions including the plurality of cathodes 20 inside the plasma generating vessel 12, electromagnets 40 which generate magnetic fields 50 along the X direction are provided.

The electromagnet 40 has a magnetic pole 42 whose dimension in the Y direction is larger than the dimension in the X direction, and a racetrack coil 44 which is wound around the magnetic pole and whose dimension in the Y direction is larger than the dimension in the X direction. The dimension in the Y direction of the magnetic pole 42 is equivalent to or larger than, for example, the dimension in the Y direction of the plasma generating vessel 12.

In this embodiment, the electromagnets 40 are paired by sandwiching the plasma generating vessel 12 in the X direction, and the magnetic poles 42 of the paired electromagnets 40 are magnetically coupled to each other by a yoke (not shown).

In this embodiment, the coils 44 of the paired electromagnets 40 are electrically connected in series to each other, and a DC exciting current $I_E$ is supplied from a common exciting power supply (DC power supply) 46. Alternatively, the exciting power supply 46 may be provided for each coil 44.

In this ion source 10b, different from the above-described related ion source, magnetic fields 50 are also applied in a direction along the X direction. Therefore, as in the case of the ion source 10a, the movable range of electrons in the plasma generating vessel 12 between the cathodes 20 and the reflecting electrode 30 or between the reflecting electrodes 30 and 32 is limited mainly to a direction along the X direction by the magnetic field 50 along the X direction, so that electron movements in the Y direction are reduced. This is because, as described above, electrons rotate around the magnetic fields 50 (Larmor precession), and they may move in the direction along the magnetic fields (that is, X direction), however, they hardly move in a direction across the magnetic fields 50 (that is, Y direction). It was also proved by electron orbit simulation that electrons gather mainly between the respective cathodes 20 and the reflecting electrode 30 and create groups equal to the number of stages of the cathodes 20. Therefore, the influence of electrons confined by the magnetic fields 50 in the X direction on plasma generation of other portions is reduced.

In addition, cathodes 20 are arranged in a plurality of respective stages along the Y direction, and the quantities of electrons to be emitted from the respective cathodes 20 may be adjusted, so that the plasma generation effects by electrons of the respective stages may be individually adjusted. As a result, the plasma density in the Y direction inside the plasma generating vessel 12 may be partially controlled.

For example, when the quantities of electrons to be emitted from the cathodes 20 are increased, collision probability of the electrons with gas molecules increases and the plasma density increases. On the contrary, when the quantities of electrons to be emitted from the cathodes 20 are reduced, collision probability of electrons with gas molecules lowers and the plasma density lowers. In addition, as described above, the movable range of electrons is limited to the X direction by the magnetic fields 50 and movements in the Y direction are less, so that the influence of partial increase or decrease in plasma density on plasma density of other portions is small.

Mainly, according to the above-described effects, by adjusting the quantities of electrons to be emitted from the cathodes 20 in the respective stages, the plasma density in the Y direction inside the plasma generating vessel 12 may be partially controlled.

As a result, for example, the uniformity of the beam current density distribution in the Y direction of the ribbon-like ion beam 2 to be extracted from the ion source 10b may be improved. Alternatively, on the contrary, by intentionally controlling the beam current density distribution to be non-uniform, a predetermined nonuniform beam current density distribution may be realized.

In this ion source 10b, the electromagnets 40 have racetrack coils whose dimensions in the Y direction are larger than the dimensions in the X direction, and are paired by sandwiching the plasma generating vessel 12 in the X direction, so that the spread in the Y direction of the magnetic fields 50 in the plasma generating vessel 12 may be reduced. As a result, the influence of electrons confined by the magnetic fields 50 on plasma generation of other portions is made smaller and a more reliable effect of partially controlling the plasma density in the Y direction in the plasma generating vessel 12 may be obtained.

In comparison with the former ion source 10a, this ion source 10b has the following advantages. (a) The number of electromagnets 40 and the number of exciting power supplies 46 for the electromagnets are smaller. (b) By the large electromagnets 40, magnetic fields 50 with excellent parallelism to the X direction, that is, magnetic fields 50 with a smaller spread in the Y direction may be generated over a wide range inside the plasma generating vessel 12, so that the movements in the Y direction of electrons are reduced more and electrons emitted from the respective cathodes 20 may be more reliably confined near the front sides of the respective cathodes 20. Therefore, the influence of control of the plasma density at a predetermined portion on other portions may be reduced, so that the controllability of the plasma density distribution is excellent.

(2) Ion Implantation Apparatus (2-1) To Improve Uniformity of Beam Current Density Distribution FIG. 3 is a drawing showing an embodiment of an ion implantation apparatus including the ion source of FIG. 2. This ion implantation apparatus performs ion implantation by making an ion beam 2 extracted from the ion source 10a on a target 52, and includes the beam measuring device 60 and the control device 70 in addition to the ion source 10a, the cathode power supplies 22, and the exciting power supplies 46. The transportation path of the ion beam 2 from the ion source 10a to the vicinity of the target 52 is inside a vacuum vessel not shown and maintained in a vacuum atmosphere.

The target 52 is, for example, a semiconductor substrate or a glass substrate, etc.

The beam measuring device 60 measures a beam current density distribution in the Y direction of the ion beam 2 in an implantation chamber (not shown) for making the ion beam 2 incident on the target 52. In detail, the beam measuring device 60 is provided near the target 52 and measures a beam current density distribution in the Y direction of the ion beam 2 at a position corresponding to the target 52.

When the beam measuring device 60 is provided in front of the target 52 as in the illustrated example, when implanting ions in the target 52, the beam measuring device 60 is moved so as not to obstruct ion implantation. When the beam measuring device 60 is provided at the rear side of the target 52, the target 52 or the like is moved so as not to obstruct measurement at the time of measurement.

The beam measuring device 60 is a multipoint beam measuring device consisting of many measuring devices (for example, Faraday cups) that are arranged in parallel in the Y direction and measure the beam current density of the ion beam 2, however, it may be structured so that one measuring device is moved in the Y direction by a moving mechanism.

This ion implantation apparatus includes a rotating device 56 which rotates a holder 54 holding the target 52 together with the target 52 around, for example, the center 52a of the target 52 as shown by the arrow E, and a driving device 58 which moves (for example, reciprocates) the entirety of the rotating device 56, the holder 54, and the target 52 along the X direction as shown by the arrow F.

Setting the dimension $W_Y$ in the Y direction of the ion beam 2 larger than the dimension in the Y direction of the target 52 and the above-described movement of the target 52 by the driving device 58 are both performed, whereby ions may be implanted in the total surface of the target 52.

Measurement information DA from the beam measuring device 60 is supplied to the control device 70. The control device 70 has a control function of making the beam current density distribution to be measured with the beam measuring device 60 more uniform by controlling the intensities of the magnetic fields 50 to be generated from the electromagnets 40 by controlling, for example, the exciting power supplies 46 (see FIG. 2) based on the measurement information DA.

As a detailed example, the control device 70 has a control function of making the beam current density distribution to be measured with the beam measuring device 60 more uniform by either weakening the magnetic field 50 to be generated from the electromagnet 40 corresponding to a region with a relatively high beam current density measured with the beam measuring device 60 or strengthening the magnetic field 50 to be generated from the electromagnet 40 corresponding to a region with a relatively small beam current density measured with the beam measuring device 60.

Therefore, according to this ion implantation apparatus, the uniformity of the beam current density distribution in the Y direction of the ribbon-like ion beam 2 in the implantation chamber may be improved.

The control device 70 may have the following adjusting functions (a) and (b).

(a) A total adjusting function of uniformly controlling the quantities of electrons to be emitted from the cathodes 20 so that an average of a total beam current density distribution measured with the beam measuring device 60 falls within a first permissible range with respect to a predetermined set value by calculating the average.

(b) An individual adjusting function by which measurement information DA from the beam measuring device 60 is divided into groups in every range corresponding to each electromagnet 40, averages of beam current density distributions in the Y direction of the respective groups are calculated, and for a group with the average out of a second permissible range with respect to the set value, the magnetic field to be generated from the electromagnet 40 corresponding to this group is weakened when the average is larger than the set value, and the magnetic field to be generated from the electromagnet 40 corresponding to the group is strengthened when the average is smaller than the set value to control all of the averages of the beam current density distributions of the respective groups so as to fall within the second permissible range with respect to the set value.

Figure 8:
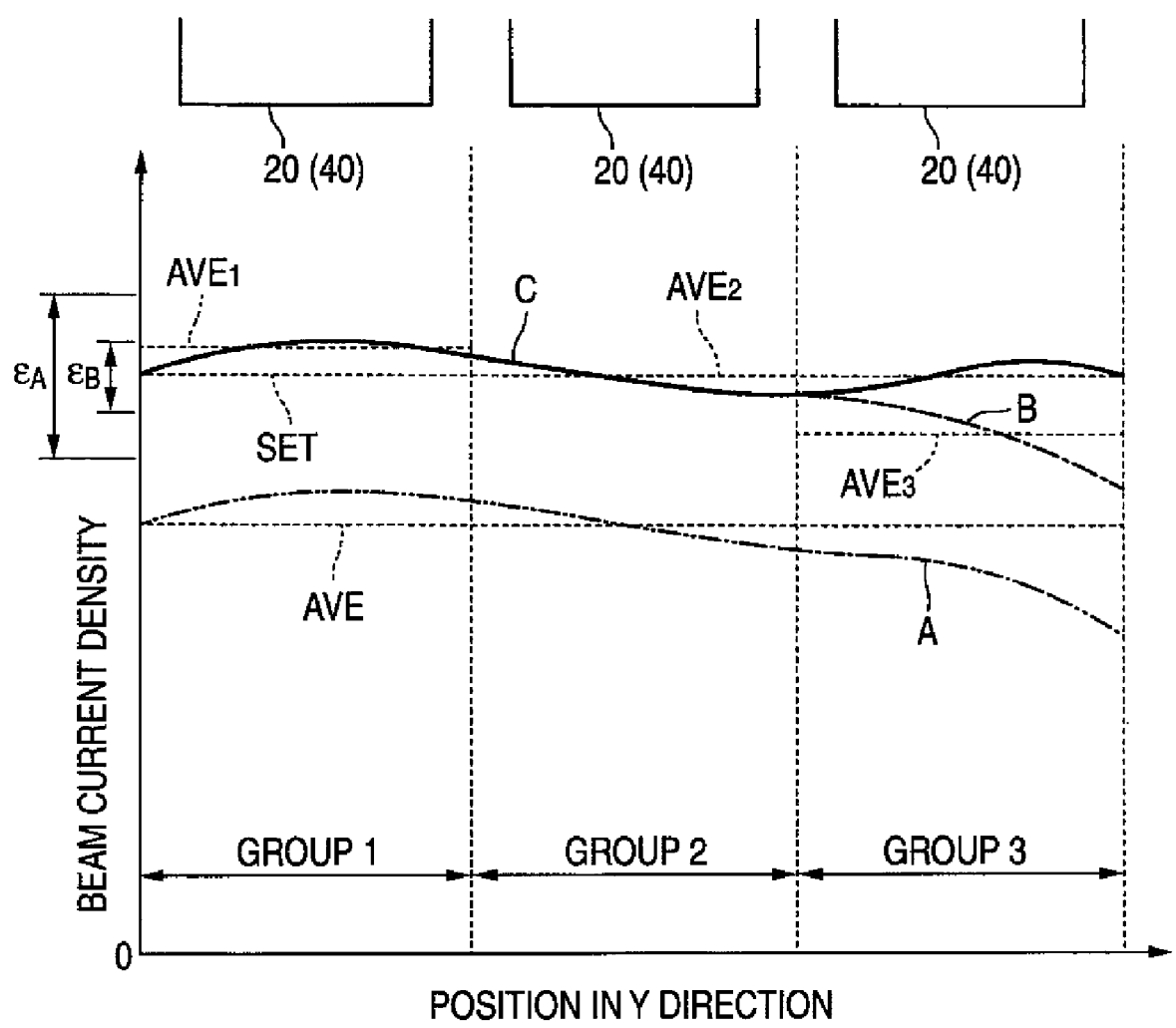
FIG. 8 is a schematic view showing examples of the beam current density distribution before and after uniformizing control.

Detailed examples of controls by the adjusting functions (a) and (b) will be described with reference to FIG. 9 and FIG. 10. General examples of beam current density distributions before and after uniformizing control are shown in FIG. 8, and in the description given below, this FIG. 8 is also referred to. The following set value SET and the permissible ranges $\epsilon_A$ and $\epsilon_B$ are set in advance in, for example, the control device 70.

Figure 9:
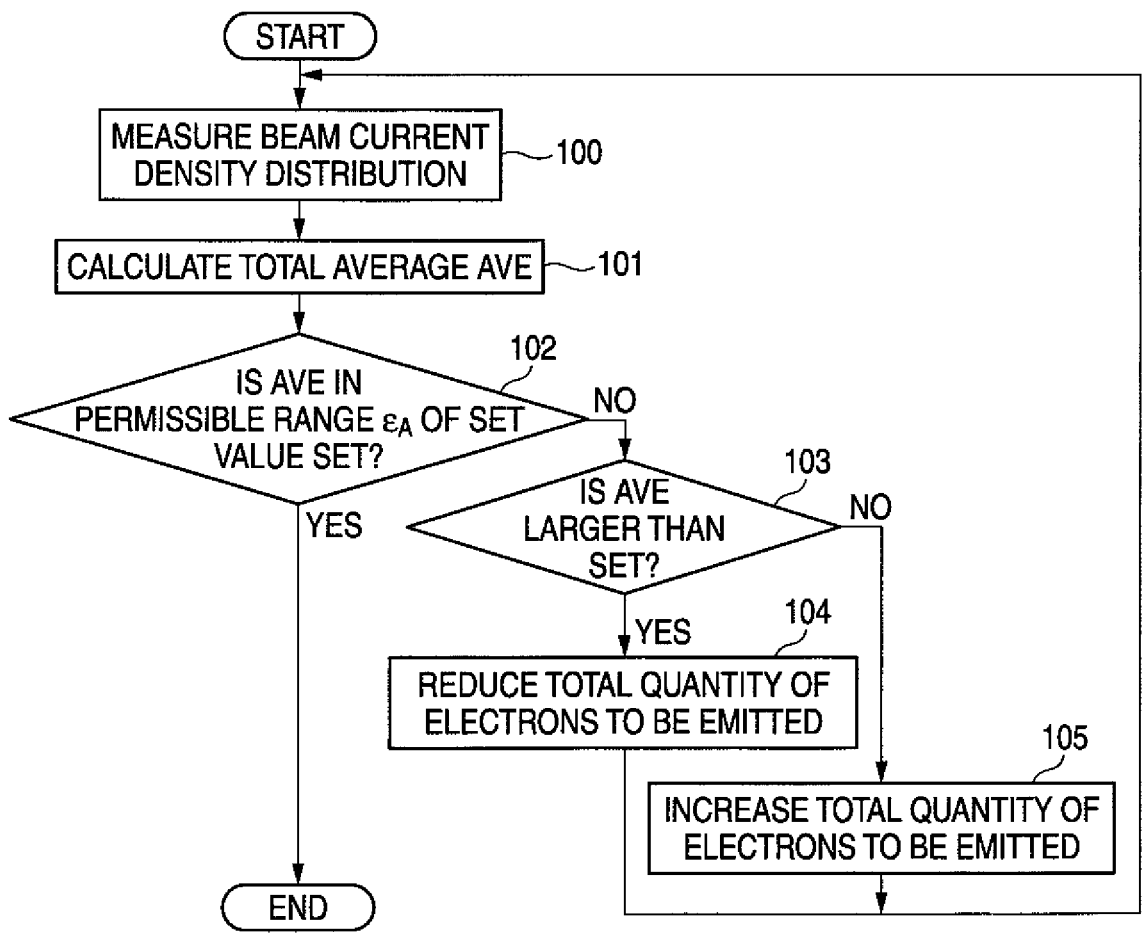
FIG. 9 is a flowchart showing an example of control of total adjustment for uniformizing the beam current density distribution.

First, the total adjustment shown in FIG. 9 is performed. Specifically, the beam current density distribution in the Y direction of the total ion beam 2 is measured with the beam measuring device 60 (Step 100). Accordingly, for example, the beam current density distribution A shown in FIG. 8 is obtained. Then, an average AVE of the beam current density distribution A is calculated (Step 101).

Then, it is judged whether this average AVE is in the first permissible range $\epsilon_A$ with respect to the set value SET (Step 102). When it is in the permissible range $\epsilon_A$, the purpose of the total adjustment is achieved, so that the total adjustment is ended.

When it is out of the permissible range $\epsilon_A$, the process advances to Step 103, and it is judged whether the average AVE is larger than the set value SET, and when it is larger, the process advances to Step 104 and control of uniformly reducing the quantities of electrons to be emitted from all cathodes 20 is performed. If the average is smaller, the process advances to Step 105 and control of uniformly increasing the quantities of electrons to be emitted from all cathodes 20 is performed. "Uniformly" means an increase or decrease by substantially equal quantities of electrons among the plurality of cathodes 20. When the number of cathodes 20 is one, the quantity of electrons to be emitted therefrom is controlled.

By increasing or decreasing the quantities of electrons, as described above, the densities of plasma 16 in the regions corresponding to the respective cathodes 20 are increased or decreased, and the beam current densities of the ion beam 2 corresponding to the respective regions are increased or decreased. Therefore, the beam current density distribution in the Y direction of the ion beam 2 changes. Thereafter, the process returns to Step 100, and the controls of Steps 100 through 105 are repeated until the average AVE falls within the permissible range $\epsilon_A$.

By the above-described total adjustment, the average AVE is controlled so as to fall within the permissible range $\epsilon_A$. Accordingly, for example, the beam current density distribution B of FIG. 8 is obtained. In this state, the individual adjustment has not been performed yet, so that the beam current density distribution B has a form similar to that of the original beam current density distribution A, and is in a form moved parallel from the beam current density distribution A.

Figure 10:
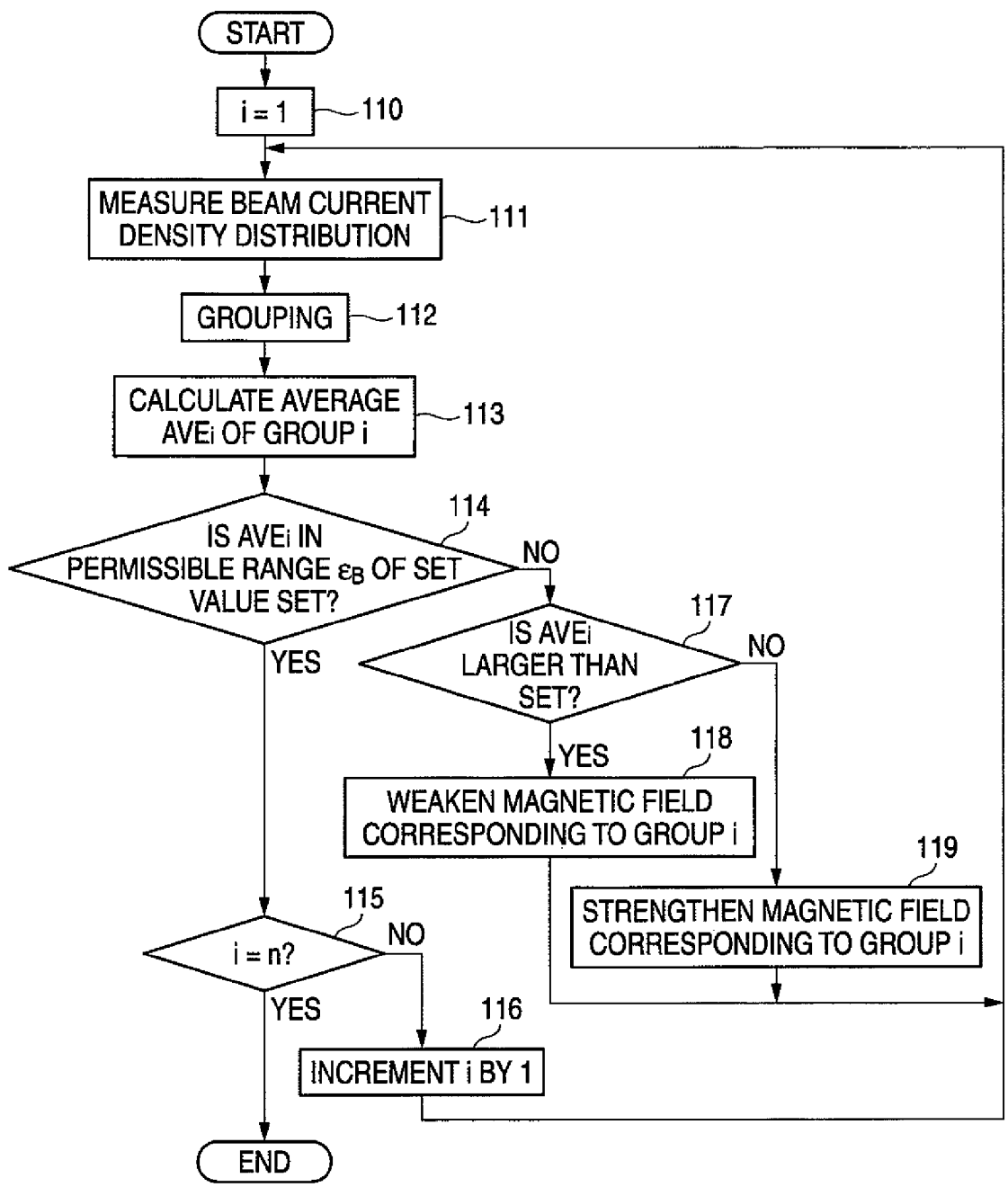
FIG. 10 is a flowchart showing an example of control of individual adjustment for uniformizing the beam current density distribution.

Normally, subsequent to the total adjustment, the individual adjustment shown in FIG. 10 is performed. In this individual adjustment, the measurement information DA from the beam measuring device 60 is divided into a plurality of groups i in every range corresponding to each electromagnet 40. "i" is a natural number between 1 and n ($\geq 2$). In detail, "n" is the number of electromagnets 40 (the number of cathodes 20 in the case of ion implantation apparatus shown in FIG. 5).

Assuming the start of measurement and control from group 1, i=1 is set (Step 110).

A total beam current density distribution in the Y direction of the ion beam 2 is measured with the beam measuring device 60 (Step 111). Accordingly, for example, the beam current density distribution B of FIG. 8 is obtained.

Then, measurement information DA from the beam measuring device 60 is divided into groups in every range corresponding to each electromagnet 40 (Step 112). When the electromagnets 40 are arranged in three stages in the Y direction, n=3, and the measurement information is divided into groups 1 through 3 as shown in FIG. 8. In other words, this grouping is grouping in every range of influence of each electromagnet 40 on the plasma density and, eventually, the beam current density in the Y direction. The reason why this grouping is possible is that the ion source 10a may partially control the beam current density in the Y direction.

Then, an average $AVE_i$ of the beam current density distribution of group i (initially 1) is calculated (Step 113), and it is judged whether the average $AVE_i$ is in the second permissible range $\epsilon_B$ with respect to the set value SET (Step 114). Normally, as shown in FIG. 8, $\epsilon_A > \epsilon_B$. When the average is in the permissible range $\epsilon_B$ (for example, refer to the averages $AVE_1$ and $AVE_2$ in FIG. 8), the corresponding group i does not need to be adjusted, so that the process advances to Step 115 and it is judged whether "i" is "n" (that is, the final group), and when "i" is "n" the individual adjustment is ended, and when "i" is not "n", the process advances to Step 116 and i is incremented by 1, and then the process returns to Step 111.

When the average $AVE_i$ is out of the permissible range $\epsilon_B$, the process advances to Step 117 and it is judged whether the average $AVE_i$ is larger than the set value SET, and when it is larger, the process advances to Step 118, the magnetic field 50 to be generated from the electromagnet 40 corresponding to the group i is weakened, and when the average is smaller (for example, refer to the average $AVE_3$ in FIG. 8), the process advances to Step 119 and the magnetic field 50 to be generated from the electromagnet 40 corresponding to the group i is strengthened.

According to the increase or decrease in the magnetic fields 50, as described above, the density of the plasma 16 in the region corresponding to each electromagnet 40 is increased or decreased, and the beam current density of the ion beam 2 corresponding to the region is increased or decreased. In other words, the beam current density of group i is increased or decreased. Accordingly, the average $AVE_i$ of group i is controlled so as to come closer to the set value SET. Thereafter, the process returns to Step 111 and the controls of Steps 111 through 114 and 117 through 119 are repeated until the average $AVE_i$ falls within the permissible range $\epsilon_B$.

By the above-described individual adjustment, the averages $AVE_i$ of the respective groups i are controlled so as to all fall within the permissible range $\epsilon_B$. Accordingly, for example, the beam current density distribution C of FIG. 8 is obtained.

The individual adjustment and the total adjustment may be repeated several times as appropriate.

When the control device 70 has the total adjusting function and the individual adjusting function, the average AVE of the total beam current density distribution in the Y direction of the ribbon-like ion beam 2 in the implantation chamber may be controlled so as to fall within the first permissible range $\epsilon_A$, and all the averages $AVE_i$ of the beam current density distributions of the respective groups i in the Y direction may be controlled so as to fall within the second permissible range $\epsilon_B$. Therefore, the average of the beam current density distribution in the Y direction of the ion beam 2 is made closer to the set value SET, and the uniformity of the beam current density distribution may be more reliably improved.

FIG. 5 is a drawing showing an embodiment of the ion implantation apparatus including the ion source of FIG. 4. The portion identical to or equivalent to that in the ion implantation apparatus shown in FIG. 3 is attached with the same reference numeral, and differences from the ion implantation apparatus of FIG. 3 will be mainly described below.

In this ion implantation apparatus, the control device 70 has a control function of making the beam current density distribution to be measured with the beam measuring device 60 more uniform by controlling the quantities of electrons to be emitted from the respective cathodes 20 by controlling, for example, the respective cathode power supplies 22 based on measurement information DA from the beam measuring device 60.

In a detailed example, the control device 70 has a control function of making the beam current density distribution to be measured with the beam measuring device 60 more uniform by either reducing the quantity of electrons to be emitted from the cathode 20 corresponding to a region with a relatively high beam current density measured with the beam measuring device 60 or increasing the quantity of electrons to be emitted from the cathode 20 corresponding to a region with a relatively small beam current density measured with the beam measuring device 60.

Therefore, according to this ion implantation apparatus, the uniformity of the beam current density distribution in the Y direction of the ribbon-like ion beam 2 in the implantation chamber may be improved.

The control device 70 may have the total adjusting function shown in (a) above and FIG. 9 and the following individual adjusting function (c).

(c) An individual adjusting function by which measurement information DA from the beam measuring device 60 is divided into groups in every range corresponding to each cathode 20, averages of the beam current density distributions in the Y direction of the respective groups are calculated, and for a group with the average being out of a second permissible range $\epsilon_B$ with respect to the set value SET, the quantity of electrons to be emitted from the cathode 20 corresponding to the group is reduced when the average is larger than the set value SET, and the quantity of electrons to be emitted from the cathode 20 corresponding to the group is increased when the average is smaller than the set value SET to control all the averages of the beam current density distributions of the groups so as to fall within the second permissible range $\epsilon_B$ with respect to the set value SET.

Figure 11:
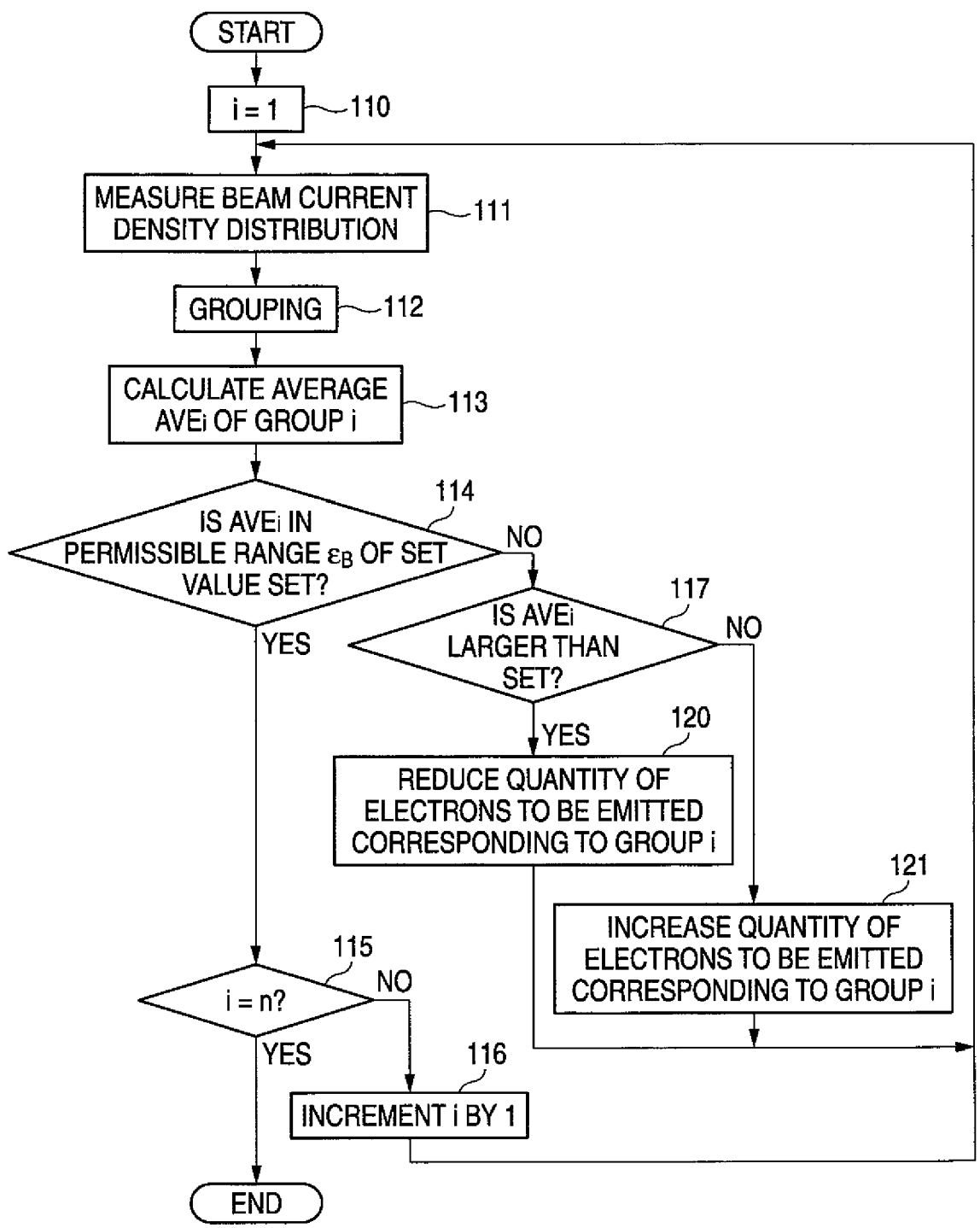
FIG. 11 is a flowchart showing another example of control of individual adjustment for uniformizing the beam current density distribution.

A detailed example of control in this individual adjusting function (c) will be described with reference to FIG. 11. The portion identical to or equivalent to that in the control of FIG. 10 is attached with the same reference numeral, and differences from the control of FIG. 10 will be mainly described.

In Step 112, measurement information DA from the beam measuring device 60 is divided into groups in every range corresponding to each cathode 20. When the cathodes 20 are arranged in three stages in the Y direction, n=3, and as shown in FIG. 8, they are divided into groups 1 through 3. In other words, this grouping is grouping in every range of influence of the cathode 20 in each stage on the plasma density and the beam current density in the Y direction. The reason why this grouping is possible is that the ion source 10b may partially control the beam current density in the Y direction as described above.

In Step 120 subsequent to Step 117, the quantity of electrons to be emitted from the cathode 20 corresponding to group i is reduced, and in Step 121, this quantity of electrons is increased.

According to the increase or decrease in quantity of electrons to be emitted, as described above, the density of the plasma 16 in a region corresponding to each cathode 20 is increased or decreased, and the beam current density of the ion beam 2 corresponding to the region is increased or decreased. That is, the beam current density of group i is increased or decreased. Accordingly, the average $AVE_i$ of group i is controlled so as to come closer to the set value SET. Thereafter, the process returns to Step 111, and the controls of Steps 111 through 114, 117, 120, and 121 are repeated until the average $AVE_i$ falls within the permissible range $\epsilon_B$.

By the above-described individual adjustment, the averages $AVE_i$ of the respective groups i are controlled so as to all fall within the permissible range $\epsilon_B$. Accordingly, for example, the beam current density distribution C of FIG. 8 is obtained.

In this case, the individual adjustment and the total adjustment may also be repeated several times as appropriate.

When the control device 70 has the above-described total adjusting function and individual adjusting function, the average AVE of the total beam current density distribution in the Y direction of the ribbon-like ion beam 2 in the implantation chamber may be made to fall within the first permissible range $\epsilon_A$, and all the averages $AVE_i$ of the beam current density distributions of the respective groups i in the Y direction may be made to fall within the second permissible range $\epsilon_B$. Therefore, the average of the beam current density distribution in the Y direction of the ion beam 2 may be made closer to the set value SET, and the uniformity of the beam current density distribution may be more reliably improved.

(2-2) To Set the Beam Current Density Distribution to a Predetermined Nonuniform Distribution In the ion implantation apparatus of FIG. 3, the control device 70 may be constructed as follows.

That is, the control device 70 has a control function of making the beam current density distribution to be measured with the beam measuring device 60 closer to a predetermined nonuniform distribution including a plurality of regions with different beam current densities by controlling the intensities of the magnetic fields 50 to be generated from the respective electromagnets 40 by controlling the exciting power supplies 46 (see FIG. 2) based on measurement information DA from the beam measuring device 60.

Therefore, according to this ion implantation apparatus, the beam current density distribution in the Y direction of the ribbon-like ion beam 2 in the implantation chamber may be set to a predetermined nonuniform distribution.

The control device 70 may have a control function by which the measurement information DA from the beam measuring device 60 is divided into groups in every range corresponding to each electromagnet 40, averages of the beam current density distributions in the Y direction of the respective groups are calculated, and the intensities of the magnetic fields 50 to be generated from the respective electromagnets 40 corresponding to the groups are controlled so that the averages fall within predetermined permissible ranges with respect to a plurality of set values including set values different from each other.

Figure 12:
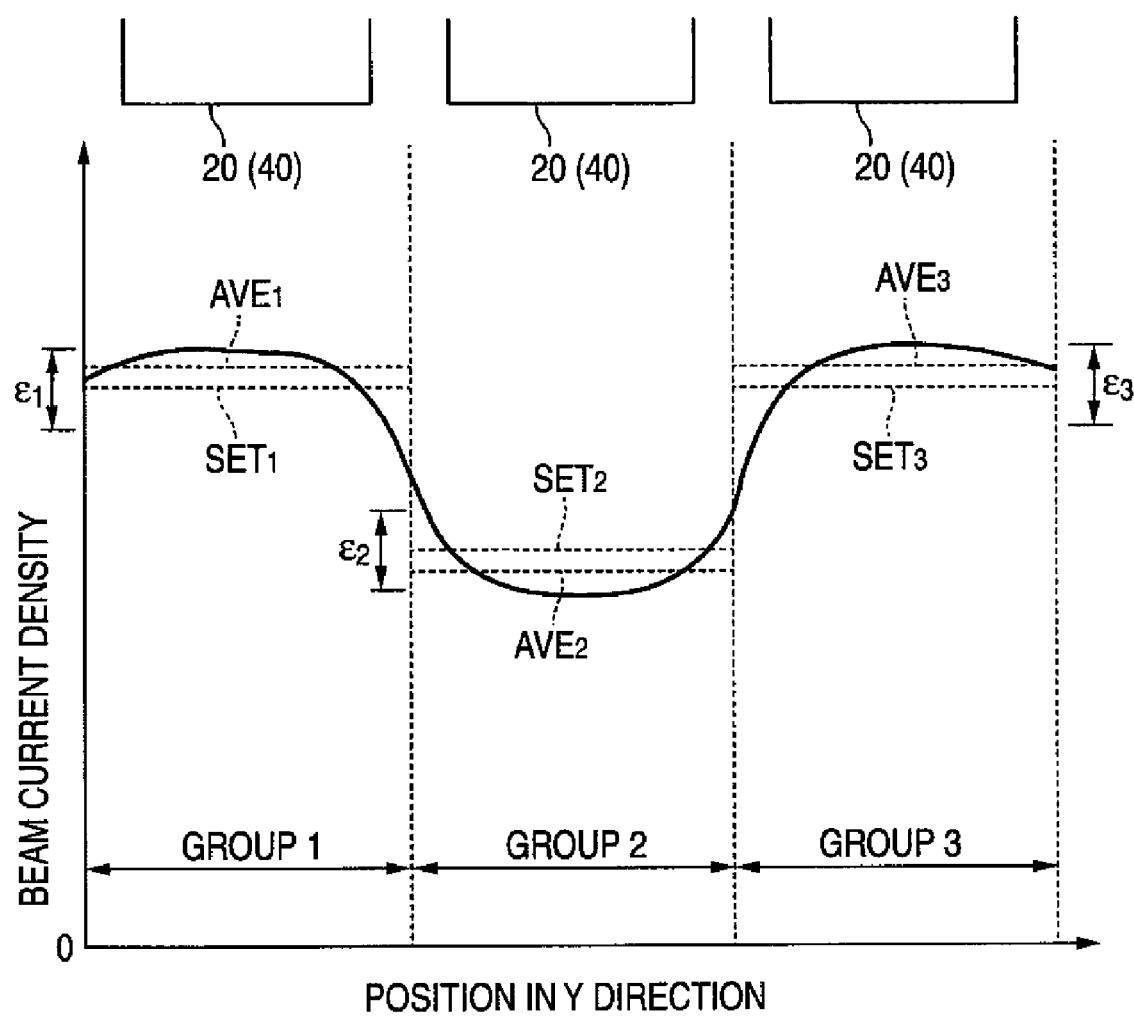
FIG. 12 is a schematic view showing an example of setting the beam current density distribution to a predetermined nonuniform distribution.

A detailed example of the control in the control device 70 in this case will be described with reference to FIG. 13. A general example of the predetermined nonuniform beam current density distribution is shown in FIG. 12, and in the following description, this FIG. 12 is also referred to. The following set values $SET_1$ through $SET_3$ and permissible ranges $\epsilon_1$ through $\epsilon_3$ are set in advance in, for example, the control device 70.

Figure 13:
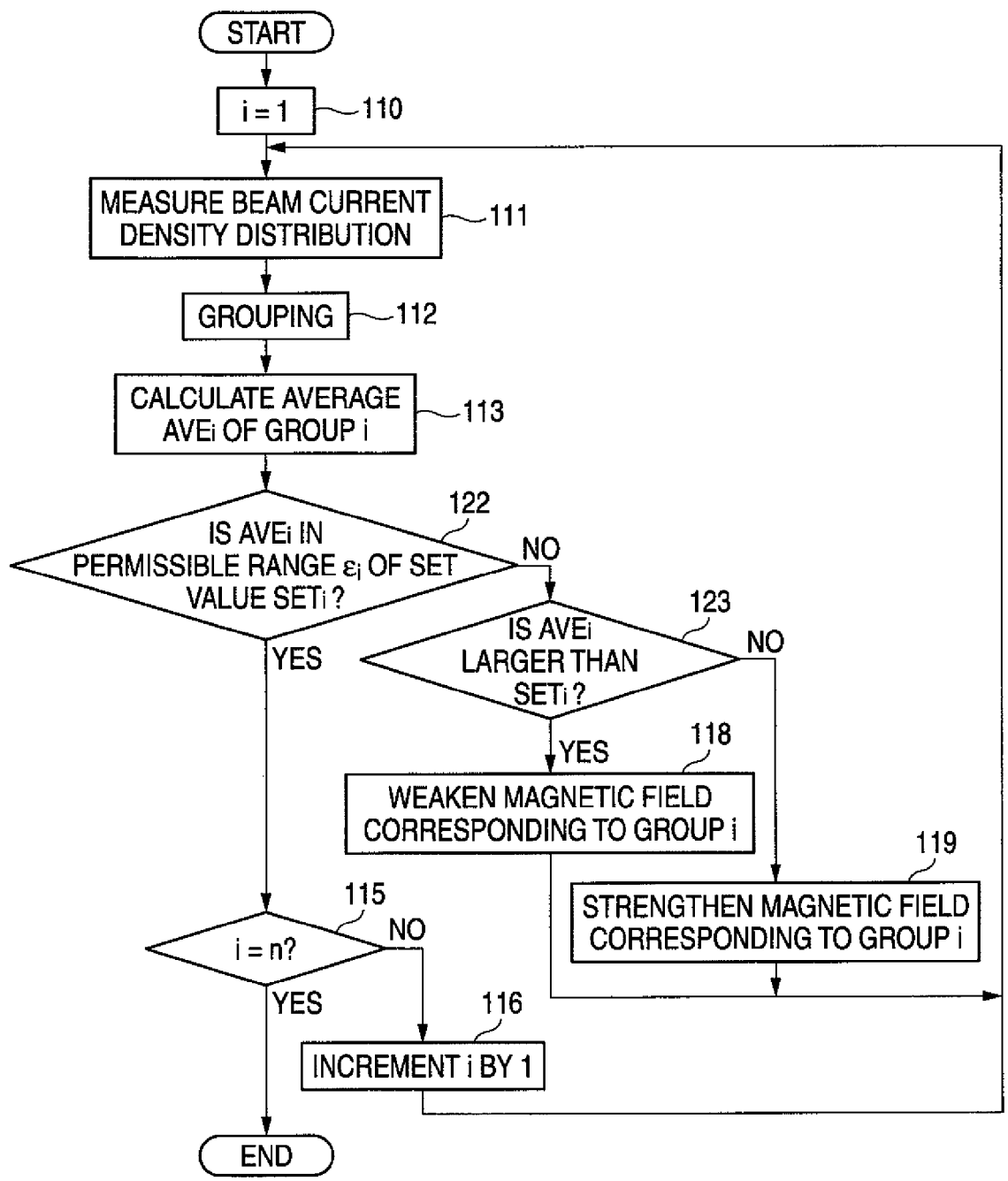
FIG. 13 is a flowchart showing an example of control to adjust the beam current density distribution to a predetermined nonuniform distribution.

FIG. 13 is similar in many points of control to FIG. 10. The identical or equivalent portion is attached with the same reference numeral, and different portions will be mainly described below. Controls of Step 122 and 123 are performed instead of Steps 114 and 117 shown in FIG. 10.

In Step 122, it is judged whether the average $AVE_i$ of the beam current density distribution of group i is in a predetermined permissible range $\epsilon_i$ with respect to a set value $SET_i$ of the group i. A plurality of set values $SET_i$ are given, and include set values different from each other. In the example shown in FIG. 12, $SET_1=SET_3\neq SET_2$. The respective permissible ranges $\epsilon_i$ may be all the same, or may be different among the groups.

When the average $AVE_i$ is out of the permissible range $\epsilon_i$, the process advances to Step 123 and it is judged whether the average $AVE_i$ is larger than the set value $SET_i$, and according to this, the process advances to Step 118 or 119. The control and operation in this Step 118 or 119 are the same as in FIG. 10. Thereafter, the process returns to Step 111 and the control of FIG. 13 is repeated until the average $AVE_i$ falls within the permissible range $\epsilon_i$.

By the above-described control, the averages $AVE_i$ of the respective groups i are controlled so as to fall within the permissible ranges $\epsilon_i$ with respect to the respective set values $SET_i$. Accordingly, for example, the beam current density distribution shown in FIG. 12 is obtained.

When the control device 70 has the above-described control function, the averages $AVE_i$ of the beam current density distributions of the groups i in the Y direction may be made to fall within the respective permissible ranges $\epsilon_i$ with respect to the plurality of set values $SET_i$ including set values different from each other, so that the beam current density distribution in the Y direction of the ribbon-like ion beam 2 in the implantation chamber may be more reliably set to a predetermined nonuniform distribution.

In the ion implantation apparatus of FIG. 5, the control device 70 may be constructed as follows.

That is, the control device 70 has a control function of making the beam current density distribution to be measured with the beam measuring device 60 closer to a predetermined nonuniform distribution including a plurality of regions with different beam current densities by controlling the quantities of electrons to be emitted from the respective cathodes 20 by controlling the respective cathode power supplies 22 based on measurement information DA from the beam measuring device 60.

Therefore, according to this ion implantation apparatus, the beam current density distribution in the Y direction of the ribbon-like ion beam 2 in the implantation chamber may be set to a predetermined nonuniform distribution.

The control device 70 may have a control function by which measurement information DA from the beam measuring device 60 is divided into groups in every range corresponding to each cathode 20, averages of the beam current density distributions in the Y direction of the respective groups are calculated, and the quantities of electrons to be emitted from the respective cathodes 20 corresponding to the groups are controlled so that the averages fall within predetermined permissible ranges with respect to a plurality of set values including set values different from each other.

Figure 14:
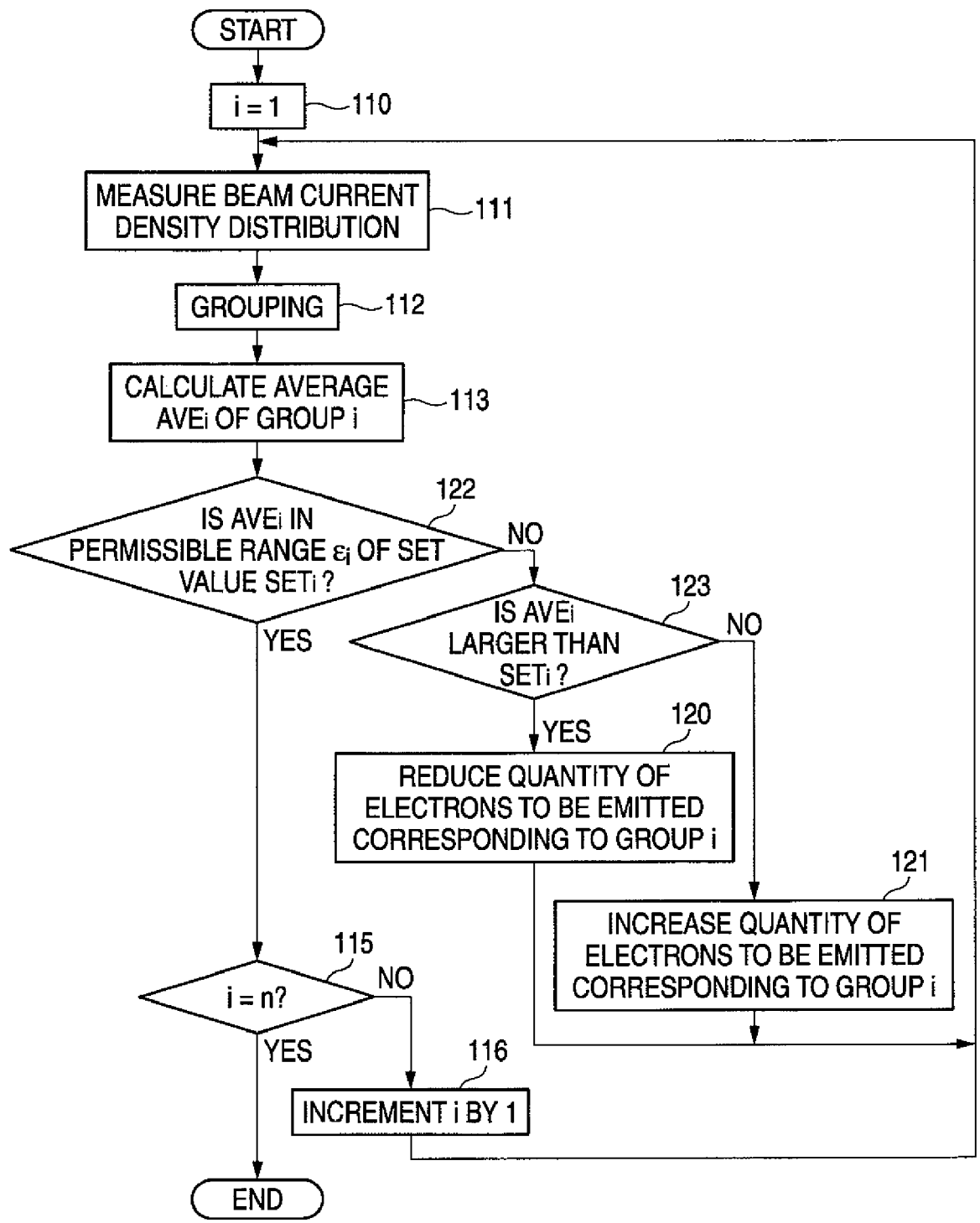
FIG. 14 is a flowchart showing another example of control to adjust the beam current density distribution to a predetermined nonuniform distribution.

A detailed example of control in this control device 70 in this case will be described with reference to FIG. 14. FIG. 14 is similar in many points of control to FIG. 11. The identical or equivalent portion is attached with the same reference numeral, and different portions will be mainly described below. Controls of Steps 122 and 123 are performed instead of Step 114 and 117 of FIG. 11. The controls of these Steps 122 and 123 are the same as in FIG. 13.

Therefore, by the control of FIG. 14, the averages $AVE_i$ of the groups i are controlled so as to fall within permissible ranges $\epsilon_i$ with respect to the respective set values $SET_i$. Accordingly, for example, the beam current density distribution shown in FIG. 12 is obtained.

When the control device 70 has the above-described control function, the averages $AVE_i$ of the beam current density distributions of the groups i in the Y direction may be made to fall within the permissible ranges $\epsilon_i$ with respect to a plurality of set values $SET_i$ including set values different from each other, so that the beam current density distribution in the Y direction of the ribbon-like ion beam 2 in the implantation chamber may be more reliably set to a predetermined nonuniform distribution.

(3) Ion Implantation Method

By using the ion implantation apparatus (see FIG. 3 and FIG. 5) which may realize the predetermined nonuniform beam current density distribution, a nonuniform dose amount distribution in a plane of the target 52 may be formed according to the following ion implantation method (A), (B), or (C). In other words, a plurality of implantation regions with dose amounts different from each other may be formed in a plane of one target 52. As a result, for example, characteristic correction and characteristic changes of a semiconductor device by means of ion implantation in a specific region inside the semiconductor device formed in the plane of the target 52 may be flexibly realized.

(A) By either mechanically moving the target 52 along the X direction so as to move across the ion beam 2 or rotating the target 52 around its center 52a, a dose amount distribution in the plane of the target 52 is formed.

(B) By both the mechanical movement of the target 52 along the X direction so as to move across the ion beam 2 and the rotation of the target 52 around its center 52a outside the irradiation region of the ion beam 2, a dose nonuniform amount distribution in the plane of the target 52 is formed.

(C) By rotating the target 52 around its center 52a inside the irradiation region of the ion beam 2, a nonuniform dose amount distribution in the plane of the target 52 is formed.

A detailed example of the above-described ion implantation method (B) will be described with reference to FIG. 15A though FIG. 16B. FIGS. 16A and 16B are subsequent to FIGS. 15A and 15B. The beam current density distribution in the Y direction of the ion beam 2 is, for example, the beam current density distribution shown in FIG. 12 (the same holds for FIGS. 17A and 17B). The beam current density distribution is indicated with the averages $AVE_1$ through $AVE_3$ in FIG. 15A through FIG. 17B.

Figure 15A:
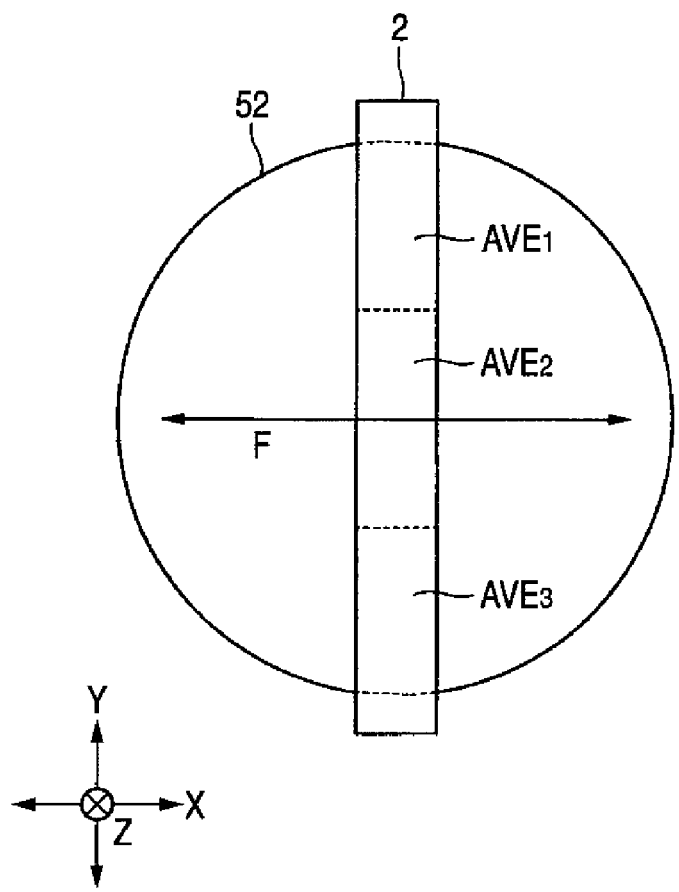
FIGS. 15A and 15B are drawings showing an embodiment of an ion implantation method for forming a nonuniform dose distribution in a plane of a target, continued to FIGS. 16A and 16B.
Figure 15B:
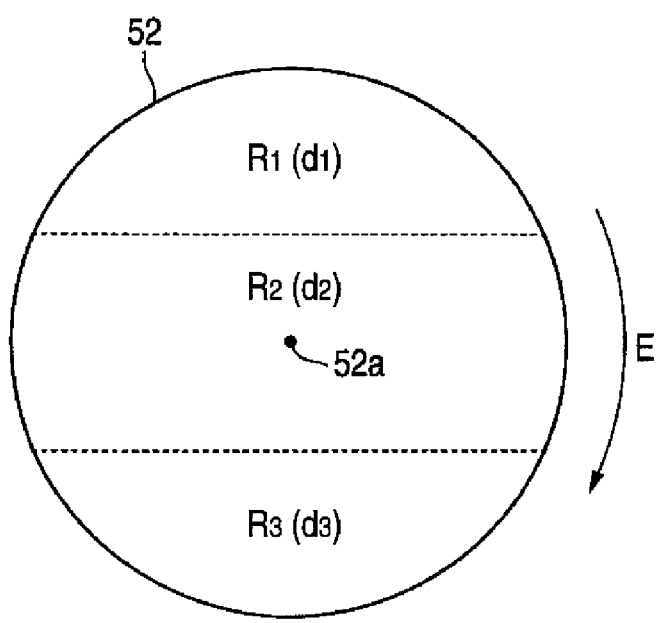
Figure 16A:
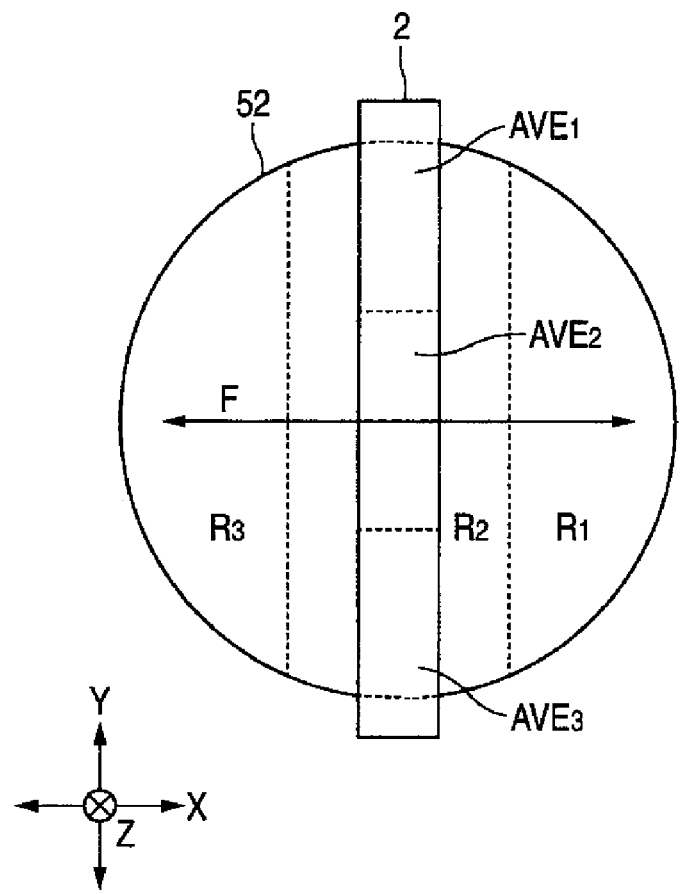
FIGS. 16A and 16B are drawings showing the embodiment of the ion implantation method for forming the nonuniform dose distribution in a plane of a target, continued from FIGS. 15A and 15B.
Figure 16B:
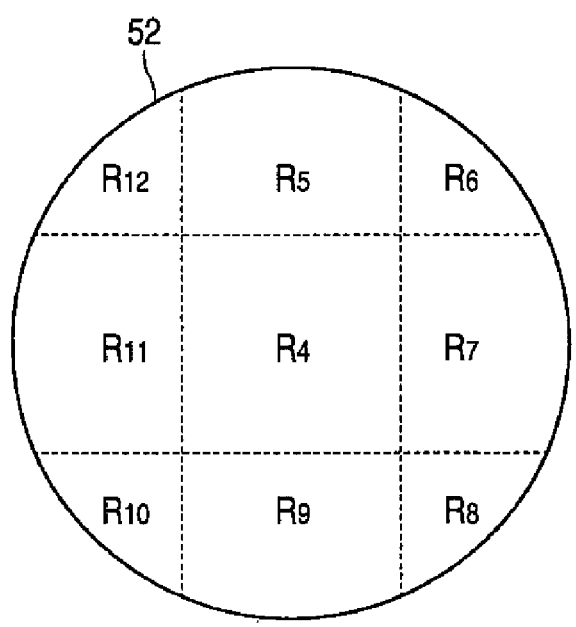

First, as shown in FIG. 15A, the target 52 is mechanically moved along the X direction so as to move across the ion beam 2 (see the arrow F). It is moved by using the above-described driving device 58. This movement may be one-way movement or reciprocation movement, and the target is moved a necessary number of times (the same holds for FIG. 16A). As a result, as shown in FIG. 15B, three implantation regions $R_1$ through $R_3$ are formed along the X direction in the plane of the target 52. For example, the dose amounts of the implantation regions R1 and R3 are defined as d1, and the dose amount of the implantation region R2 is defined as d2.

When the beam current density distribution of the ion beam 2 gently changes, for example, as shown in FIG. 12, the boundaries between the implantation regions $R_1$ through $R_3$ have, in actuality, gradation. That is, the dose amount gently changes. The same holds for the boundaries between other implantation regions described later.

Subsequently, as shown in FIG. 15B, outside the irradiation region of the ion beam 2, the target 52 is rotated around its center 52a (see the arrow E). It is rotated by using the rotating device 56. The angle of this rotation is 90 degrees in this example, however, it is not limited to this.

Next, as shown in FIG. 16A, the target 52 is mechanically moved along the X direction so as to move across the ion beam 2. This is similar to the case of FIG. 15A. According to this movement, as in the case of FIG. 15A, three implantation regions are formed along the X direction in the plane of the target 52, and these are superposed on the implantation regions $R_1$ through $R_3$. As a result, as shown in FIG. 16B, in the plane of the target 52, nine implantation regions $R_4$ through $R_{12}$ are formed. The dose amounts $d_4$ through $d_{12}$ of the implantation regions $R_4$ through $R_{12}$ are expressed by the following equations.

$$d_4 = 2d_2$$
$$d_5 = d_1 + d_2$$
$$d_6 = 2d_1$$
$$d_7 = d_1 + d_2$$
$$d_8 = 2d_1$$
$$d_9 = d_1 + d_2$$
$$d_{10} = 2d_1$$
$$d_{11} = d_1 + d_2$$
$$d_{12} = 2d_1 \quad \text{[Equation 1]}$$

Thus, a nonuniform dose amount distribution may be formed in the plane of the target 52.

It is also allowed that the rotation angle of the target 52 is set to a degree other than 90 degrees, for example, to a degree smaller than 90 degrees, and the target 52 is moved along the X direction and rotated a larger number of times than in FIG. 15A though FIG. 16B.

Figure 17A:
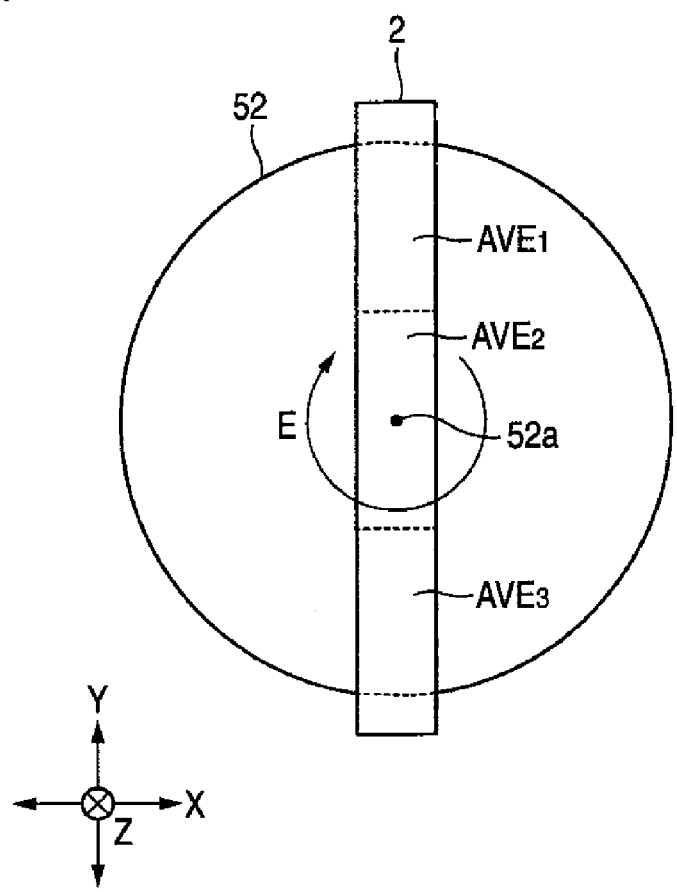
FIGS. 17A and 17B are drawings showing another embodiment of the ion implantation method for forming a nonuniform dose distribution dose amount distribution in a plane of a target.
Figure 17B:
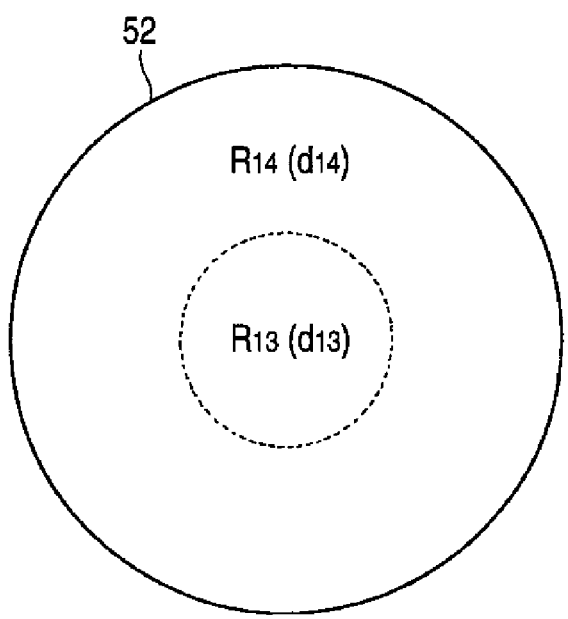

A detailed example of the above-described ion implantation method (C) will be described with reference to FIGS. 17A and 17B. As shown in FIG. 17A, the target 52 is rotated around its center 52a inside the irradiation region of the ion beam 2 (see the arrow E). It is rotated by using the above-described rotating device 56. The number of rotations may be set to a necessary number. As a result, as shown in FIG. 17B, a circular implantation region $R_{13}$ is formed at the center, and around this region, a ring-like implantation region $R_{14}$ is formed. When the dose amounts of the implantation regions $R_{13}$ and $R_{14}$ are defined as $d_{13}$ and $d_{14}$, $d_{13} \neq d_{14}$.

A nonuniform dose amount distribution may be thus formed in a plane of the target 52.

The dose amount distribution is merely an example, and dose amount distributions other than the above-described example may also be formed by setting the state of the beam current density distribution in the Y direction of the ion beam 2, the movement in the X direction of the target 52, and the rotation of the target 52 to be other than the above-described example.

What is claimed is:

1. An ion source which generates a ribbon-like ion beam having a dimension in a Y direction in a plane substantially orthogonal to a traveling direction larger than a dimension in a X direction substantially orthogonal to the Y direction, comprising:

a plasma generating vessel which generates a plasma inside, serves as an anode, introduces a gas inside, and having an ion extraction port extending in the Y direction;

a cathode which is provided with at least one side in the X direction of the plasma generating vessel and generates the plasma by ionizing the gas which is generated discharge inside the plasma generating vessel by emitting an electron into the plasma generating vessel;

a reflecting electrode which is arranged at least on the other side in the X direction inside the plasma generating vessel opposite to the cathode, and is set to a negative potential or a floating potential with respect to the plasma generating vessel and reflects the electron inside the plasma generating vessel; and a plurality of electromagnets which respectively generate a magnetic field along the X direction inside the plasma generating vessel and are arranged in a plurality of stages along the Y direction.

2. The ion source according to claim 1, wherein the electromagnets are paired by sandwiching the plasma generating vessel in the X direction.

3. The ion implantation apparatus according to claim 1, comprising:

a cathode power supply which emits a electron by heating the cathode of the ion source;

a plurality of exciting power supplies which supply a DC exciting current to each electromagnet of the ion source;

a beam measuring device which measures a beam current density distribution in the Y direction of the ion beam in an implantation chamber for making the ion beam generated from the ion source on a target; and a control device which controls the exciting power supplies, an intensity of the magnetic field to be respectively generated from the electromagnets, and the beam current density distribution to be approached the uniformity on the basis of a measurement information from the beam measuring device.

4. The ion implantation apparatus according to claim 3, wherein the control device weakens the magnetic field to be respectively generated from the electromagnets corresponding to a region with a relatively high beam current density measured with the beam measuring device, and strengthens the magnetic field to be respectively generated from the electromagnets corresponding to a region with a relatively small beam current density measured with the beam measuring device.

5. The ion implantation apparatus according to claim 3, wherein
the control device comprises:
(a) a total adjusting function which uniformly controls quantity of electrons to be emitted from the cathode so that an average of a total beam current density distribution measured with the beam measuring device falls within a first permissible range with respect to a set value by calculating the average; and
(b) an individual control function by which the measurement information from the beam measuring device is divided into groups in every range corresponding to each electromagnet, averages of the beam current density distributions in the Y direction of the groups are calculated, and control is performed so that all of the averages of the beam current density distributions of the groups fall within a second permissible range with respect to a set value by weakening a magnetic field to be respectively generated from the electromagnets corresponding to a group having the average out of the second permissible range with respect to the set value when the average is larger than the set value, and by strengthening a magnetic field to be respectively generated from the electromagnets corresponding to the group when the average is smaller than a set value.

6. The ion implantation apparatus according to claim 1 comprising:
a cathode power supply which emits electrons by heating the cathode of the ion source;
a plurality of exciting power supplies which respectively supply a DC exciting current to the electromagnets of the ion source;
a beam measuring device which measures a beam current density distribution in the Y direction of the ion beam in an implantation chamber for making the ion beam generated from the ion source incident on a target; and
a control device which controls the exciting power supplies, a intensity of the magnetic field to be respectively generated from the electromagnets, and a beam current density distribution to approach a nonuniform distribution including a plurality of regions with a different beam current density on the basis of a measurement information from the beam measuring device.

7. The ion implantation apparatus according to claim 6, wherein the control device has a control function by which the measurement information from the beam measuring device is divided into groups in every range corresponding to each electromagnet, averages of beam current density distributions in the Y direction of the groups are calculated, and the intensities of magnetic field to be respectively generated from the electromagnets corresponding to the respective groups are controlled so that the averages fall within permissible ranges with respect to a plurality of set values including set values different from each other.

8. An ion implantation method according to claim 6, wherein a nonuniform dose amount distribution is formed in a plane of a target by either mechanically moving the target along the X direction across the ion beam from the ion source or rotating the target around its center.

9. The ion implantation method according to claim 6, wherein a nonuniform dose amount distribution is formed in a plane of the target by mechanically moving the target along the X direction across the ion beam from the ion source and rotating the target around its center outside an irradiation region of the ion beam.

10. The ion implantation method according to claim 6, wherein a nonuniform dose amount distribution is formed in a plane of the target by rotating the target around its center within an irradiation region of the ion beam from the ion source.

11. An ion source which generates a ribbon-like ion beam having a dimension in a Y direction in a plane substantially orthogonal to a traveling direction larger than a dimension in a X direction substantially orthogonal to the Y direction, comprising:
a plasma generating vessel which generates a plasma inside, serves as an anode, introduces a gas inside, and having an ion extraction port extending in the Y direction;
a plurality of cathodes which are provided with at least one side in the X direction of the plasma generating vessel along the Y direction and generate the plasma by ionizing the gas which is generated discharge inside the plasma generating vessel by emitting an electron into the plasma generating vessel;
a reflecting electrode which is arranged at least on the other side in the X direction inside the plasma generating vessel opposite to the cathode, and is set to a negative potential or a floating potential with respect to the plasma generating vessel and reflects the electron inside the plasma generating vessel; and
an electromagnet which generates a magnetic field along the X direction in a region including the cathodes in the plasma generating vessel.

12. The ion source according to claim 11, wherein the electromagnet has racetrack coils whose dimensions in the Y direction are larger than their dimensions in the X direction, and is paired by sandwiching the plasma generating vessel in the X direction.

13. The ion implantation apparatus according to claim 11 comprising:
a plurality of cathode power supplies which emits the electron by respectively heating the cathodes of the ion source;
a exciting power supply for supplies a DC exciting current to the electromagnets of the ion source;
a beam measuring device which measures a beam current density distribution in the Y direction of the ion beam in an implantation chamber for making the ion beam generated from the ion source on a target; and
a control device which controls the cathode power supplies, a quantity of electrons to be respectively generated from the cathodes, and the beam current density distribution to be approached the uniformity on the basis of a measurement information from the beam measuring device.

14. The ion implantation apparatus according to claim 13, wherein the control device reduces the quantity of electrons to be respectively emitted from the cathodes corresponding to a region with a relatively high beam current density measured with the beam measuring device, and increases the quantity of electrons to be respectively emitted from the cathodes corresponding to a region with a relatively small beam current density measured with the beam measuring device.

15. The ion implantation apparatus according to claim 13, wherein the control device has:
(a) a total adjusting function which uniformly controls quantity of electrons to be emitted from the cathodes so that an average of a total beam current density distribution measured with the beam measuring device falls within a first permissible range with respect to a set value by calculating the average; and
(b) an individual control function by which the measurement information from the beam measuring device is divided into groups in every range corresponding to each cathode, averages of the beam current density distributions in the Y direction of the groups are calculated, and control is performed so that all of the averages of the beam current density distributions of the groups fall within a second permissible range with respect to a set value by reducing the quantity of electrons to be respectively emitted from the cathodes corresponding to a group having the average out of the second permissible range with respect to the set value when the average is larger than the set value, and by increasing the quantity of electrons to be respectively emitted from the cathodes corresponding to the group when the average is smaller than a set value.

16. The ion implantation apparatus according to claim 11 comprising:

a plurality of cathode power supplies which emit the electron by respectively heating the cathodes of the ion source;

a exciting power supply for supplying DC exciting currents to the electromagnets of the ion source;

a beam measuring device which measures a beam current density distribution in the Y direction of the ion beam in an implantation chamber for making the ion beam generated from the ion source incident on a target; and a control device which controls the cathode power supplies, the quantity of electrons to be respectively emitted from the cathodes, and a beam current density distribution to be measured with the beam measuring device closer to a nonuniform distribution including a plurality of regions with different beam current densities on the basis of the measurement information from the beam measuring device.

17. The ion implantation apparatus according to claim 16, wherein the control device has a control function by which the measurement information from the beam measuring device is divided into groups in every range corresponding to each cathode, averages of beam current density distributions in the Y direction of the groups are calculated, and the quantity of electrons to be respectively emitted from the cathodes corresponding to the respective groups are controlled so that the averages fall within permissible ranges with respect to a plurality of set values including set values different from each other.

18. An ion implantation method according to claim 16, wherein a nonuniform dose amount distribution is formed in a plane of a target by either mechanically moving the target along the X direction across the ion beam from the ion source or rotating the target around its center.

19. The ion implantation method according to claim 16, wherein a nonuniform dose amount distribution is formed in a plane of the target by mechanically moving the target along the X direction across the ion beam from the ion source and rotating the target around its center outside an irradiation region of the ion beam.

20. The ion implantation method according to claim 16, wherein a nonuniform dose amount distribution is formed in a plane of the target by rotating the target around its center within an irradiation region of the ion beam from the ion source.

* * * * *